United States Patent
Joe

(10) Patent No.: US 10,132,869 B2
(45) Date of Patent: Nov. 20, 2018

(54) APPARATUS FOR ESTIMATING STATE OF SECONDARY BATTERY INCLUDING BLENDED POSITIVE ELECTRODE MATERIAL AND METHOD THEREOF

(71) Applicant: LG CHEM, LTD., Seoul (KR)

(72) Inventor: Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 261 days.

(21) Appl. No.: 15/029,048

(22) PCT Filed: Oct. 14, 2014

(86) PCT No.: PCT/KR2014/009646
§ 371 (c)(1),
(2) Date: Apr. 13, 2016

(87) PCT Pub. No.: WO2015/056963
PCT Pub. Date: Apr. 23, 2015

(65) Prior Publication Data
US 2016/0259011 A1  Sep. 8, 2016

(30) Foreign Application Priority Data

Oct. 14, 2013  (KR) .................. 10-2013-0122271
Oct. 13, 2014  (KR) .................. 10-2014-0137725

(51) Int. Cl.
*G01R 31/36* (2006.01)
*H01M 10/48* (2006.01)

(52) U.S. Cl.
CPC ....... *G01R 31/3648* (2013.01); *G01R 31/362* (2013.01); *G01R 31/3651* (2013.01);
(Continued)

(58) Field of Classification Search
CPC .............. G01R 31/3648; G01R 31/362; G01R 31/3662; G01R 31/3651; G01R 31/3679; G01R 31/3624; H01M 10/48
See application file for complete search history.

(56) References Cited

U.S. PATENT DOCUMENTS

| 6,677,082 B2 | 1/2004 | Thackeray et al. |
| 6,680,143 B2 | 1/2004 | Thackeray et al. |

(Continued)

FOREIGN PATENT DOCUMENTS

| JP | 2012-57998 A | 3/2012 |
| KR | 10-2008-0041702 A | 5/2008 |

(Continued)

OTHER PUBLICATIONS

Barbarisi et al., "State of charge Kalman filter estimator for automotive batteries," Control Engineering Practice, vol. 14, No. 3, Mar. 1, 2006 (Available online Jun. 16, 2005), pp. 267-275, XP027906187.

(Continued)

*Primary Examiner* — Douglas King
(74) *Attorney, Agent, or Firm* — Birch, Stewart, Kolasch & Birch, LLP

(57) ABSTRACT

An apparatus for estimating a state of a secondary battery by using an Extended Kalman Filter is provided, in which the secondary battery includes a positive electrode including a first positive electrode material and a second positive electrode material having different operating voltage ranges from each other, a negative electrode including a negative electrode material, and a separator interposed therebetween. The apparatus includes a sensor unit which measures voltage and current of the secondary battery at time intervals, and a control unit electrically connected with the sensor unit, and estimates the state of the secondary battery including a state of charge of at least one of the first positive electrode material, the second positive electrode material, or the (Continued)

negative electrode material, by implementing an Extended Kalman Filter algorithm using a state equation including, as a state parameter, the state of charge of at least one of the first positive electrode material, the second positive electrode material, or the negative electrode material, and an output equation including, as an output parameter, the voltage of the secondary battery. The state equation and the output equation are derived from a circuit model which includes a first positive electrode material circuit unit and a second positive electrode material circuit unit connected in parallel with each other, and a negative electrode material circuit unit connected in series with these two circuit units.

23 Claims, 24 Drawing Sheets

(52) U.S. Cl.
CPC ........ *G01R 31/3662* (2013.01); *H01M 10/48* (2013.01); *G01R 31/3624* (2013.01); *G01R 31/3679* (2013.01)

(56) References Cited

U.S. PATENT DOCUMENTS

| | | | |
|---|---|---|---|
| 8,548,762 | B2 | 10/2013 | Prada et al. |
| 2007/0046292 | A1 | 3/2007 | Plett |
| 2008/0241666 | A1* | 10/2008 | Baba ............... H01M 4/505 |
| | | | 429/158 |
| 2009/0001992 | A1 | 1/2009 | Tsuchiya |
| 2010/0174499 | A1 | 7/2010 | Kang et al. |
| 2013/0110429 | A1 | 5/2013 | Mitsuyama et al. |
| 2014/0358459 | A1* | 12/2014 | Trnka ............... G01R 31/3651 |
| | | | 702/63 |

FOREIGN PATENT DOCUMENTS

| | | |
|---|---|---|
| KR | 10-2009-0020470 A | 2/2009 |
| KR | 10-0996693 B1 | 11/2010 |
| WO | WO 2006/025662 A1 | 3/2006 |
| WO | WO 2014/130519 * | 2/2013 |

OTHER PUBLICATIONS

Di Domenico et al., "Lithium-Ion battery State of Charge estimation with a Kalman Filter based on a electrochemical model," 17th IEEE International Conference on Control Applications, Multi-conference on Systems and Control, San Antonio, Texas, USA, Sep. 3-5, 2008, pp. 702-707, XP031324238.

Klein et al., "Electrochemical Model Based Observer Design for a Lithium-Ion Battery," IEEE Transactions on Control Systems Technology, vol. 21, No. 2, Mar. 1, 2013 (Feb. 14, 2013, first published Jan. 2, 2012), pp. 289-300, XP011494332.

International Search Report Issued in PCT/KR2014/009646, dated Jan. 12, 2015.

Plett, "Extended Kalman filterin for battery management systems of LiPB-based HEV battery packs Part 1. Background", Journal of Power Sources, vol. 134, 2004, pp. 252-261.

\* cited by examiner

| SOC | OCV |
|---|---|
| 0 | 3.421 |
| 5 | 3.612 |
| 10 | 3.644 |
| 15 | 3.677 |
| 20 | 3.698 |
| 25 | 3.714 |
| 30 | 3.73 |
| 35 | 3.747 |
| 40 | 3.76 |
| 45 | 3.777 |
| 50 | 3.8 |
| 55 | 3.826 |
| 60 | 3.858 |
| 65 | 3.894 |
| 70 | 3.935 |
| 75 | 3.98 |
| 80 | 4.031 |
| 85 | 4.085 |
| 90 | 4.145 |
| 95 | 4.209 |
| 100 | 4.278 |
| 101 | 4.5 |

| SOC | $R_{0,c1}$ |
|---|---|
| 100 | 0.001436 |
| 70 | 0.001436 |
| 50 | 0.001436 |
| 40 | 0.001436 |
| 30 | 0.001436 |
| 25 | 0.001436 |
| 20 | 0.003 |
| 15 | 0.0079 |
| 10 | 0.031 |
| 5 | 0.319 |
| 0 | 392461364 |

APPARATUS FOR ESTIMATING STATE OF SECONDARY BATTERY INCLUDING BLENDED POSITIVE ELECTRODE MATERIAL AND METHOD THEREOF

TECHNICAL FIELD

The present disclosure relates to a method and an apparatus for estimating a state of a secondary battery using Extended Kalman Filter (EKF).

The present application claims the benefit of Korean Patent Application No. 10-2013-0122271 filed on Oct. 14, 2013 with the Korean Intellectual Property Office, the disclosure of which is incorporated herein by reference in its entirety. Additionally, the present application claims the benefit of Korean Patent Application No. 10-2014-0137725 filed on Oct. 13, 2014 with the Korean Intellectual Property Office, the disclosure of which is incorporated herein by reference in its entirety.

BACKGROUND ART

Batteries, which generate electrical energy by way of electrochemical oxidation and reduction, are used over a wide range of applications. For example, the batteries are used in gradually expanding fields, including: devices carried around in user's hands, such as portable phones, laptop computers, digital cameras, video camera, tablet computers, electrically-driven tools, and so on; electrically-driven apparatus such as electric bicycles, electric auto-bicycles, electric vehicles, hybrid vehicles, electric boats, electric airplanes, and so on; power storage apparatus for use in storing electricity generated from renewable energy or surplus generated electricity; or uninterruptable power supply to stably supply electricity to a variety of information communication devices including server computer, base station for communication, and so on.

The battery includes three basic elements which are: a negative electrode containing a material that undergoes oxidation and releases electrons during discharging; a positive electrode containing a material that undergoes reduction and accepts electrons during discharging; and an electrolyte that allows migration of operating ions between the negative electrode and the positive electrode.

The battery can be categorized into a primary battery which is not reusable once it is discharged, and a secondary battery which has at least partially reversible electrochemical reaction, thus are repetitively chargeable and dischargeable.

For the secondary battery, lead-acid battery, nickel-cadmium battery, nickel-zinc battery, nickel-iron battery, silver oxide battery, nickel metal hydride battery, zinc-manganese oxide battery, zinc-bromide battery, metal-air battery, lithium secondary battery, and so on, are known. Among these, the lithium secondary battery is attracting greatest commercial attentions, in view of its relatively higher energy density, higher battery voltage and longer storage life than the other secondary batteries.

Concerning the lithium secondary battery, materials used for positive electrode material and negative electrode material have critical influence on the performance of the secondary battery. Accordingly, a variety of efforts are being made to provide the positive electrode material and the negative electrode material which have stability at high temperature, and can provide high energy capacity and low manufacture cost.

DISCLOSURE

Technical Problem

The present disclosure is designed to solve the problems of the related art, and therefore the present disclosure is directed to providing a blended positive electrode material by mixing two or more positive electrode materials, thus compensating for disadvantages of the respective positive electrode materials, and providing an apparatus and a method for estimating, with reliability, the state of the secondary battery including the blended positive electrode material, by using Extended Kalman Filter (EKF).

Technical Solution

In one aspect of the present disclosure, there is provided an apparatus for estimating a state of a secondary battery including a positive electrode including a blended positive electrode material, a negative electrode including a negative electrode material, and a separator interposed between the positive electrode and the negative electrode, by using Extended Kalman Filter (EKF).

According to some embodiments, the state of the secondary battery may refer to a parameter that cyclically changes in the course of secondary battery charging and discharging, among the electrochemical properties of the secondary battery or an electrode material contained in the secondary battery.

According to one aspect, the voltage or the state of charge of a secondary battery increases and then decreases within a predetermined range according to charging and discharging. Accordingly, the voltage and the state of charge are included as the state parameters that indicate the state of the secondary battery.

According to another aspect, the state of charge of each of the electrode materials included in the secondary battery are also included as the state parameters that indicate the state of the secondary battery.

For example, as the secondary battery is charged or discharged, the capacities of the negative electrode material and the positive electrode material change cyclically. Accordingly, by defining a relative ratio of the current capacities of the negative electrode material and the positive electrode material to total capacities of the negative electrode material and the positive electrode material, the state of charge of the negative electrode material and that of the positive electrode material are also included as the parameters indicating the state of the secondary battery.

The state of charge is known in the art as the State of Charge (SOC) parameter. The state of charge can be expressed as a quantitative value with parameters SOC and z, in which the state of charge is expressed as percentage (0-100%) with the parameter SOC, and the state of charge is expressed as a number (0-1) with the parameter z. The state of charge may be measured with, without limitation, ampere counting method.

According to one aspect, the blended positive electrode material includes at least a first positive electrode material and a second positive electrode material with different operating voltage ranges from each other. In one example, when the secondary battery is in discharge mode, the first positive electrode material is activated in a relatively higher voltage range than the second positive electrode material. When the secondary battery is in charge mode, the second positive electrode material is activated in a relatively lower voltage range than the first positive electrode material. The 'activating' of the first positive electrode material or the second positive electrode material as used herein refers to reacting of the first positive electrode material or the second positive electrode material with the operating ions. Accordingly, the concentration of the operating ions reacting with the first positive electrode material, and the concentration of the operating ions reacting with the second positive electrode material, show differences depending on the voltage of the secondary battery.

The 'operating ions' as used herein refers to ions involved in electrochemical reaction with the first and the second positive electrode materials during operation, i.e., during charging or discharging of the secondary battery including the blended positive electrode material. The operating ions may vary depending on a type of the secondary battery. In one example, for a lithium secondary battery, lithium ions may be the operating ions. Hereinbelow, unless otherwise specified, the operation of the secondary battery is defined as referring to charging or discharging of the secondary battery.

The 'reacting (reaction)' refers to the electrochemical reaction that accompanies the operating process of a secondary battery, including oxidation and reduction of the first and the second positive electrode materials, and may vary depending on an operating mechanism of the secondary battery.

In one example, the electrochemical reaction may refer to the operating ions intercalated into the first positive electrode material and/or the second positive electrode material, or in contrast, de-intercalated therefrom. In such examples, the concentration of the operating ions intercalated into the first and the second positive electrode materials, or the concentration of the operating ions de-intercalated from the first and the second positive electrode materials may vary as the voltage of the secondary battery changes. In one example, under condition that the secondary battery is discharged, the operating ions may be preferentially intercalated into the first positive electrode material rather than the second positive electrode material in certain voltage range, and conversely in the other voltage range. In another example, under condition that the secondary battery is charged, the operating ions may be preferentially de-intercalated from the second positive electrode material rather than the first positive electrode material in certain voltage range, and conversely in the other voltage range.

According to one aspect, to satisfy the condition that the concentration of the operating ions reacting with the first and the second positive electrode materials differs according to change in the voltage, the first and the second positive electrode materials may satisfy at least one of the following conditions.

In one example, when the first and the second positive electrode materials are measured for dQ/dV distribution, there may be differences in the locations of the main peaks appearing in dQ/dV distribution of each of the positive electrode materials and/or in the intensity of the main peaks.

The 'dQ/dV distribution' as used herein refers to capacity characteristic per voltage of the positive electrode material as to the operating ions. The differences in the locations of the main peaks may vary depending on the type of first and second positive electrode materials.

In another example, as a result of measuring discharge resistance per state of charge of a secondary battery including the first and the second positive electrode materials, the discharge resistance profile may have a convex pattern.

In yet another example, as a result of measuring discharge resistance per state of charge of a secondary battery including the first and the second positive electrode materials, the discharge resistance profile may have at least two points of inflection before and after the apex of the convex pattern.

In yet another example, when the secondary battery including the first and the second positive electrode materials is charged or discharged, at least one voltage plateau may appear in the charge or discharge profile. The 'voltage plateau' as used herein refers to a region where the point of inflection is present and where there is a small voltage variation before and after the point of inflection.

In yet another example, at least one of the first and the second positive electrode materials may have a voltage profile that includes the voltage plateau.

According to one aspect, the first positive electrode material may be an alkali metal compound expressed by general chemical formula $A[A_xM_y]O_{2+z}$ (where, A includes at least one element of Li, Na or K; M includes at least one element selected from among Ni, Co, Mn, Ca, Mg, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; and x, y, z and stoichiometric coefficients of components contained in M are so selected that the compound maintains electric neutrality).

Optionally, the first positive electrode material may be the alkali metal compound $xLiM^1O_2$-$(1-x)Li_2M^2O_3$ (where, $M^1$ includes at least one element having a mean oxidation state of 3; $M^2$ includes at least one element having a mean oxidation state of 4; and $0 \leq x \leq 1$), as disclosed in U.S. Pat. No. 6,677,082, U.S. Pat. No. 6,680,143, and so on.

According to another aspect, the second positive electrode material may be lithium metal phosphate expressed by general chemical formula $Li_aM^1_xFe_{1-x}M^2_yP_{1-y}M^3_zO_{4-z}$ (where $M^1$ includes at least one element selected from among Ti, Si, Mn, Co, Fe, V, Cr, Mo, Ni, Nd, Mg and Al; $M^2$ includes at least one element selected from among Ti, Si, Mn, Co, Fe, V, Cr, Mo, Ni, Nd, Mg, Al, As, Sb, Si, Ge, V and S; $M^3$ includes one element selected from halogen group optionally including F; $0 < a \leq 2$, $0 \leq x \leq 1$, $0 \leq y < 1$, $0 \leq z < 1$; and a, x, y, z and stoichiometric coefficient of components contained in $M^1$, $M^2$, and $M^3$ are so selected that the compound maintains electric neutrality), or $Li_3M_2(PO_4)_3$ [where, M includes at least one element selected from among Ti, Si, Mn, Fe, Co, V, Cr, Mo, Ni, Mg and Al].

According to yet another aspect, the first positive electrode material may be $Li[Li_aNi_bCo_cMn_d]O_{2+z}$ ($a \geq 0$; $a+b+c+d=1$; at least one from among b, c and d is not 0; $-0.1 \leq z \leq 2$). Further, the second positive electrode material may be one or more selected from the group consisting of $LiFePO_4$, $LiMn_xFe_yPO_4$ ($0<x+y \leq 1$), and $Li_3Fe_2(PO_4)_3$.

According to yet another aspect, the first positive electrode material and/or the second positive electrode material may include a coating layer. The coating layer may include a carbon layer, or may include an oxide layer or a fluoride layer including at least one element selected from the group consisting of Ti, Si, Mn, Co, Fe, V, Cr, Mo, Ni, Nd, Mg, Al, As, Sb, Si, Ge, V and S.

According to the present disclosure, the mixing ratio of the first and the second positive electrode materials may be properly adjusted in consideration of electrochemical design conditions, by taking into consideration a purpose of using the secondary battery that is intended to be fabricated.

Further, the number of positive electrode materials that may be included in the blended positive electrode material is not limited to 2. According to one embodiment, the blended positive electrode material may include three different positive electrode materials, and an example may include a blended positive electrode material including $LiMn_2O_4$, $Li[Li_aNi_xCo_yMn_z]O_2$ [$a \geq 0$; $a+x+y+z=1$; at least one of x, y and z is not 0], and $LiFePO_4$. According to yet another embodiment, the blended positive electrode material may include four different positive electrode materials, and an example may include a blended positive electrode material including $LiNiO_2$, $LiMn_2O_4$, $Li[Li_aNi_xCo_yMn_z]O_2$ [$a \geq 0$; $a+x+y+z=1$; at least one of x, y and z is not 0], and $LiFePO_4$. Further, to enhance the property of the blended positive electrode material blend, other additives such as, for example, conducting agent, binder, and so on, may be added to the blended positive electrode material without limitation.

According to the present disclosure, the blended positive electrode material may be used as a positive electrode material of a secondary battery that is mounted to various types of electrically-driven apparatuses operable on electrical energy, and the electrically-driven apparatuses are not limited to any specific kind.

According to one aspect, the electrically-driven apparatus may be a mobile computer apparatus such as mobile phone, laptop computer, tablet computer, and so on, or hand-held multimedia apparatus including digital camera, video camera, audio/video playback device, and so on.

According to another aspect, the electrically-driven apparatus may be an electric power apparatus movable by electricity, such as, electric vehicle, hybrid vehicle, electric bicycle, electric motorbicycle, electric train, electric boat, electric airplane, and so on, or a power tool including a motor, such as, electric drill, electric grinder, and so on.

According to yet another aspect, the electrically-driven apparatus may be a mass power storage apparatus installed at electrical grids to store renewable energy or surplus generated electricity, or uninterruptable power supply supplying electricity to a variety of information communications apparatus including server computer or mobile communication equipment in the event of emergency such as blackout, and so on.

According to the present disclosure, the apparatus for estimating a state of a secondary battery including a blended positive electrode material may include: (i) a sensor unit which measures voltage and current of the secondary battery at time intervals; (ii) and a control unit which is electrically connected with the sensor unit and estimates a state of the secondary battery, in which the state includes a state of charge of at least one of the first positive electrode material or the second positive electrode material, and optionally, a state of charge of the negative electrode material, by implementing the extended Kalman algorithm with a state equation including, as state parameters, the state of charge of at least one of the first positive electrode material or the second positive electrode material, and optionally, the state of charge of the negative electrode material, and an output equation including, as an output parameter, the voltage of the secondary battery.

Preferably, the state equation and the output equation may be derived from a circuit model, in which the circuit model may include (i) a first and a second positive electrode material circuit units respectively corresponding to the first and the second positive electrode materials and connected in parallel with each other, and optionally, (ii) a negative electrode material circuit unit corresponding to the negative electrode material and connected in series with the first and the second positive electrode material circuit units.

According to one aspect, the first positive electrode material circuit unit, the second positive electrode material circuit unit, and the negative electrode material circuit unit may each include an open-circuit voltage element which changes voltage according to the state of charge of the corresponding electrode material, and, as an optional element, an impedance element which changes voltage by current.

According to the present disclosure, the state parameter may include at least one voltage selected from the group consisting of: a voltage formed by the impedance element of the first positive electrode material circuit unit; a voltage formed by the impedance element of the second positive electrode material circuit unit; and a voltage formed by the impedance element included in the negative electrode material circuit unit.

According to one aspect, the state equation may include, as input parameters, a first current flowing through the first positive electrode material circuit unit, and a second current flowing through the second positive electrode material circuit unit.

The control unit may determine the first current and the second current, by using current distribution equation derived from the circuit model, and the current measured by the sensor unit.

According to another aspect, the output equation is derived from the voltage analysis of the circuit model, and may include a plurality of input parameters.

Preferably, the plurality of input parameters may include: (i) current measured by the sensor unit; (ii) open-circuit voltage component of the first positive electrode material circuit unit; (iii) open-circuit voltage component of the second positive electrode material circuit unit; (iv) optionally, open-circuit voltage component of the negative electrode material; (v) optionally, impedance voltage component of the first positive electrode material circuit unit; (vi) optionally, impedance voltage component of the second positive electrode material circuit unit; and (vii) optionally, impedance voltage component of the negative electrode material circuit unit.

According to one aspect, the state equation may be defined such that the first current flowing through the first positive electrode material circuit unit, the second current flowing through the second positive electrode material circuit unit, and optionally, the current of the secondary battery flowing through the negative electrode material circuit unit, are added up according to time, respectively, thereby to determine the states of charge of the first positive electrode material, the second positive electrode material, and optionally, the negative electrode material. In the above example, the control unit may time-update the states of charge of the first positive electrode material, the second positive electrode material and optionally, the negative electrode material, by implementing [state estimate time update] of the Extended Kalman Filter algorithm, by using the state equation.

According to another aspect, the state equation may be defined such that each of the voltages formed by the respective impedance elements vary according to time, by the impedance voltage formula derived from the circuit analysis of the impedance elements included in the first positive electrode material circuit unit, the second positive electrode material circuit unit, and optionally, the negative electrode material circuit unit. In the above example, the control unit may time-update each of the voltages formed by the respective impedance elements, by implementing [state estimate time update] of the Extended Kalman Filter algorithm, by using the state equation.

Preferably, the control unit may implement an [error covariance time update] of the Extended Kalman Filter algorithm, by using Jacobian matrices derived from the state equation.

Further, the control unit may estimate the voltage of the secondary battery as an output parameter, by implementing

[output estimation] of the Extended Kalman Filter algorithm, by using the output equation.

Further, the control unit may implement [Kalman gain determination] of the Extended Kalman Filter algorithm, by using the Jacobian matrices derived from the output equation and the time-updated error covariance.

Further, the control unit may implement [state estimate measurement update] of the Extended Kalman Filter algorithm, by reflecting the determined Kalman gain to a difference between the measured secondary battery voltage and the estimated secondary battery voltage.

Further, the control unit may implement [error covariance measurement update] of the Extended Kalman Filter algorithm, by using the time-updated error covariance and the determined Kalman gain.

Preferably, the state equation and the output equation may each include a process noise and a sensor noise.

According to the present disclosure, the control unit may estimate the state of charge of the secondary battery, by using the state of charge of the first positive electrode material and the state of charge of the second positive electrode material, and the capacity of the first positive electrode material and the capacity of the second positive electrode material.

According to one aspect, the impedance elements optionally included in the first positive electrode material circuit unit, the second positive electrode material circuit unit, and the negative electrode material circuit unit may include at least one resistor, at least one capacitor, at least one inductor, or a combination thereof.

Preferably, the optionally included impedance element may include an RC circuit in which the resistor and the capacitor are connected in parallel, and optionally, a resistor connected in series with the same.

Preferably, the open-circuit voltage elements and the impedance elements included in the first positive electrode material circuit unit, the second positive electrode material circuit unit, and the negative electrode material circuit unit may be connected in series.

The control unit may be a battery management system (BMS) which may be electrically coupled with the secondary battery, or a control element included in the BMS.

The battery management system described above may refer to a system that is called BMS in the technical field pertinent to the present disclosure, but from the perspective of functions, the battery management system may include in its scope any system as long as the system performs at least one function as described herein.

The battery management system may include the circuit model as a software algorithm implementable by a processor. In one example, the circuit model may be written as program codes and stored in a memory device, and implemented by the processor.

In order to achieve the technical objects mentioned above, the present disclosure provides a method for estimating a state of a secondary battery including a blended positive electrode material.

First, a step of measuring voltage and current of the secondary battery at time intervals is performed.

Next, a state of charge of at least one of the first positive electrode material or the second positive electrode material, and optionally, a state of charge of the negative electrode material are estimated, by implementing the Extended Kalman Filter algorithm using a state equation and an output equation, in which the state equation includes, as state parameters, the state of charge of at least one of the first positive electrode material or the second positive electrode material, and optionally, the state of charge of the negative electrode material, and the output equation includes, as output parameters, the voltage of the secondary battery, The state equation and the output equation are derived from the circuit model, in which the circuit model (i) may include a first positive electrode material circuit unit including an open-circuit voltage element corresponding to the first positive electrode material, and optionally, an impedance element, (ii) may additionally include a second positive electrode material circuit unit including an open-circuit voltage element corresponding to the second positive electrode material and optionally, an impedance element, and being connected in parallel with the first positive electrode material circuit unit, and (iii) may optionally include a negative electrode material circuit unit including an open-circuit voltage element corresponding to the negative electrode material and optionally, an impedance element, and being connected in series with the first and the second positive electrode material circuit units.

The technical objects of the present disclosure may also be achieved by a computer-readable recording medium recording therein program codes of a method for estimating a state of a secondary battery including a blended positive electrode material according to the present disclosure.

Advantageous Effects

The present disclosure gives the following effects. According to one aspect, the state of a secondary battery including a blended positive electrode material exhibiting unique voltage variation behavior can be estimated with reliability. Accordingly, it is possible to blend various combinations of positive electrode materials, which was impossible due to the unique voltage variation behavior. Further, it is possible to provide a blended positive electrode material which is optimized for the purpose of using a secondary battery, by selecting, from among various types of positive electrode materials, two or more positive electrode materials in several combinations to suit the purpose of using the secondary battery, and blending the same.

According to another aspect of the present disclosure, the unique voltage variation behavior hinders various adjustments of mixing ratio of the blended positive electrode material. However, since reliable prediction of the unique voltage variation behavior is enabled, it is possible to adjust the mixing ratio of the positive electrode materials contained in the blended positive electrode material under various conditions to suit the purpose of use.

According to yet another aspect of the present disclosure, since it is possible to blend various positive electrode materials with various compositions and ratios according to the purpose of using the secondary battery, it is possible to dynamically respond to changes in the positive electrode materials employed in the electric vehicles or power storage apparatuses, or changes in the specification.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Figure 1:
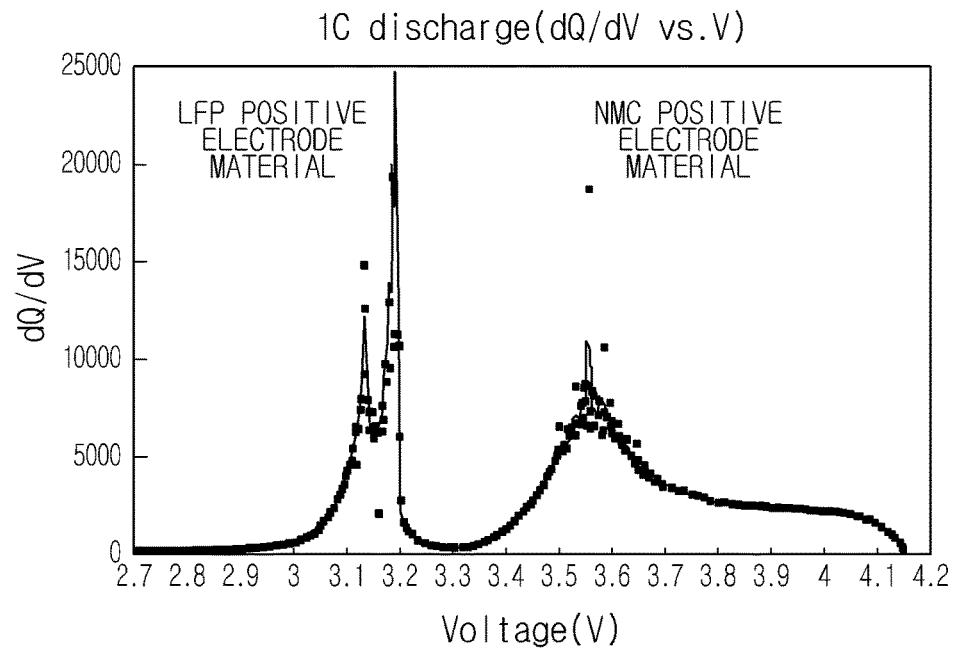
FIG. 1 is a graph of dQ/dV distribution of a lithium secondary battery including $Li[Ni_{1/3}Mn_{1/3}Co_{1/3}]O_2$ (NMC positive electrode material) and $LiFePO_4$ (LFP positive electrode material).

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

In the embodiments described below, the technical concept of the present disclosure is applied to a lithium secondary battery. The 'lithium secondary battery' as used herein encompasses a secondary battery in which lithium ions act as the operating ions during charging and discharging, thus inducing electrochemical reaction in the positive electrode and the negative electrode. The 'operating ion' represents the ion that participates in the electrochemical oxidation and reduction during operation (charging or discharging) of the secondary battery, and may be lithium, for example. Accordingly, even when the name of the secondary battery may change according to a type of electrolyte or separator used in the secondary battery, a type of packing material used for packing the secondary battery, or an interior or exterior structure of the lithium secondary battery, any secondary battery that uses lithium ions as the operating ions will have to be interpreted as falling under the scope of the lithium secondary battery.

Further, the present disclosure is applicable to other secondary batteries as well as the lithium secondary battery. Accordingly, regardless of whether the operating ions are lithium ions or not, any secondary battery should be interpreted as being falling under the scope of the present disclosure without being limited in its kind, as long as it can apply the technical concept of the present disclosure.

Further, the secondary battery is not limited by the number of elements constructing the same. Accordingly, the secondary battery should be interpreted as encompassing not only a single cell that has a basic unit consisting of a negative electrode, electrolyte, and a positive electrode, but also an assembly of single cells, a module in which a plurality of assemblies are connected in series and/or in parallel, a pack in which a plurality of modules are connected in series and/or in parallel, a battery system in which a plurality of packs are connected in series and/or in parallel, and so on.

According to an embodiment of the present disclosure, the positive electrode of the secondary battery for voltage estimation includes a blended positive electrode material. The blended positive electrode material includes at least a first positive electrode material and a second positive electrode material, and the concentration of the operating ions reacting with the first positive electrode material and the concentration of the operating ions reacting with the second positive electrode material exhibit differences according to variation in the secondary battery voltage. That is, the first positive electrode material and the second positive electrode material have different operating voltage ranges from each other. The 'operating ions' as used herein refers to ions that electrochemically react with the first and the second positive electrode materials in the process the secondary battery is operated. In an example in which the secondary battery is a lithium secondary battery, the lithium ions are the operating ions.

The 'reacting (reaction)' refers to the electrochemical reaction that accompanies the operating process of a secondary battery, including oxidation and reduction of the first and the second positive electrode materials, and may vary depending on an operating mechanism of the secondary battery.

In one example, the electrochemical reaction may refer to the operating ions being intercalated into, or conversely, de-intercalated from the first positive electrode material and/or the second positive electrode material. In such example, the concentration of the operating ions intercalated into the first and the second positive electrode materials, or the concentration of the operating ions de-intercalated from the first and the second positive electrode materials may vary as the voltage of the secondary battery varies.

In one example, under condition that the secondary battery is discharged, the operating ions may be preferentially intercalated into the first positive electrode material rather than the second positive electrode material in certain voltage range, and conversely in the other voltage range.

In another example, under condition that the secondary battery is charged, the operating ions may be preferentially de-intercalated from the second positive electrode material rather than the first positive electrode material in certain voltage range, and conversely in the other voltage range.

According to one aspect, to satisfy the condition that the concentration of the operating ions reacting with the first and the second positive electrode materials differs according to voltage variation, the first and the second positive electrode materials may satisfy at least one of the following conditions.

In one example, when the first and the second positive electrode materials are measured for dQ/dV distribution, there may be differences in the locations of the main peaks appearing in dQ/dV distribution of each of the positive electrode materials and/or in the intensity of the main peaks.

The 'dQ/dV distribution' as used herein refers to capacity characteristic per voltage of the the positive electrode material as to operating ions. The differences in the locations of the main peaks may vary depending on types of first and second positive electrode materials.

FIG. 1 is a graph of a result of measuring dQ/dV distribution of a lithium secondary battery by applying 1 c-rate discharge condition, in which the lithium secondary battery includes a blended positive electrode material in a positive electrode, and a carbon material in a negative electrode, and the blended positive electrode material includes $Li[Ni_{1/3}Mn_{1/3}CO_{1/3}]O_2$ (hereinbelow, 'NMC positive electrode material') and $LiFePO_4$ (hereinbelow, 'LFP positive electrode material') blended at a ratio of 7:3 (weight ratio).

Referring to FIG. 1, the peak on the left side corresponds to the main peak of the LFP positive electrode material, and the peak on the right corresponds to the main peak of the NMC positive electrode material, thus indicating that the LFP positive electrode material and the NMC positive electrode material have main peaks at different locations and/or with different intensities. Further, the profile appearing around the main peak of the LFP positive electrode material is generated by the reaction between the LFP positive electrode material and the lithium ions, and the profile appearing around the main peak of the NMC positive electrode material is generated by the reaction between the NMC positive electrode material and the lithium ions. Accordingly, at low voltage range, it is mainly the LFP positive electrode material that reacts with the lithium ions, while at high voltage range, it is mainly the NMC positive electrode material that reacts with the lithium ions. Such dQ/dV measurement result clearly shows the fact that the NMC positive electrode material and the LFP positive electrode material have different operating voltage ranges, since the concentration of the operating ions reacting with the NMC positive electrode material and the LFP positive electrode material varies according to voltage variation. That is, at high voltage range, the reaction between the NMC positive electrode material and the operating ions is dominant, while at low voltage range, the reaction between the LFP positive electrode material and the operating ions is dominant.

In another example, when there is a difference appearing in the concentration of the operating ions reacting with the first and the second positive electrode materials according to voltage of the secondary battery, as a result of measuring discharge resistance per state of charge of a secondary battery including the blended positive electrode material, the discharge resistance profile may have a convex pattern, or the discharge resistance profile may have at least two points of inflection before and after the apex of the convex pattern.

Figure 2:
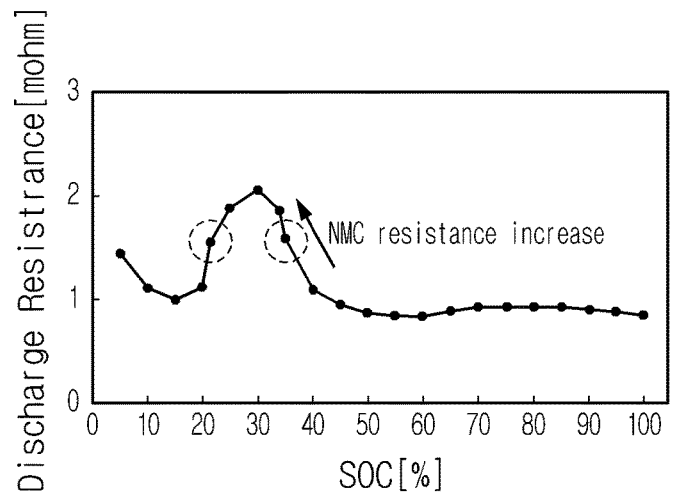
FIG. 2 is a graph of a discharge resistance profile of a lithium secondary battery including NMC positive electrode material and LFP positive electrode material.

FIG. 2 shows a discharge resistance profile showing a result of measuring discharge resistance according to change in state of charge (SOC), regarding a lithium secondary battery including a blended positive electrode material in a positive electrode, and carbon material in a negative electrode, in which the blended positive electrode material includes NMC positive electrode material and LFP positive electrode material blended at 7:3 (weight ratio).

Referring to FIG. 2, the discharge resistance profile of the lithium secondary battery including the blended positive electrode material has the convex pattern when SOC is from about 20% to about 40%. Further, the discharge resistance profile shows point of inflection (in dotted circles) occurring two times, i.e., when SOC is from about 20% to about 30%, and from about 30% to about 40%. It has already been explained above with reference to FIG. 1 that the concentration of the operating ions reacting with the NMC positive electrode material and the LFP positive electrode material varies according to voltage variation. Accordingly, it is obvious that, when the discharge resistance profile of the secondary battery including the first and the second positive electrode materials has a convex pattern, or also when the discharge resistance profile has two points of inflection before and after the apex of the convex pattern, the concentration of the operating ions reacting with the first and the second positive electrode materials will vary according to voltage variation, leading into change in the operating voltage ranges of the first and the second positive electrode materials.

In yet another example, when the concentration of the operating ions reacting with the first and the second positive electrode materials shows differences according to the voltage of the secondary battery, a voltage plateau may appear in the charge or discharge profile at least once, when the secondary battery including the blended positive electrode material is charged or discharged. The 'voltage plateau' as used herein refers to a region having a point of inflection and where a curvature of the voltage profile varies before and after the point of inflection. In a state of charge range where the curvature of the voltage profile changes, the voltage variation is relatively smaller compared to the variation in the state of charge.

Figure 3:
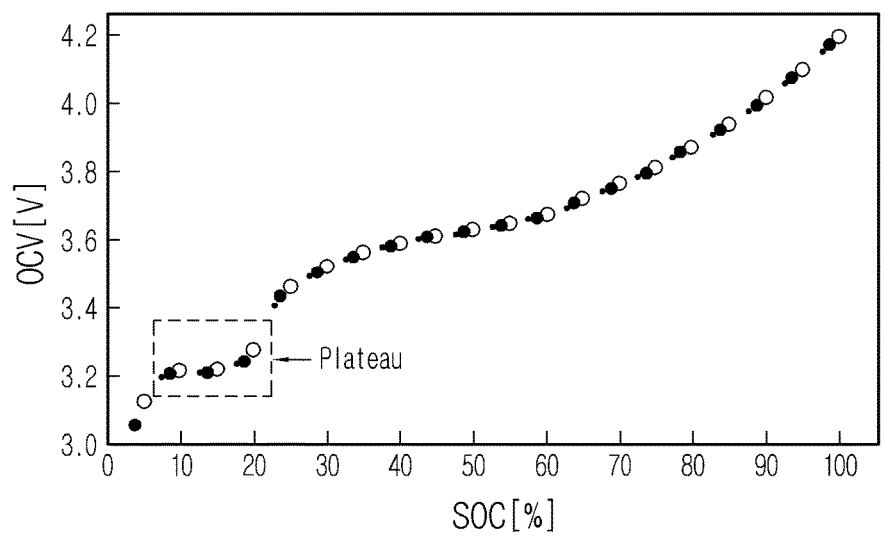
FIG. 3 is a graph of a discharge voltage profile of a lithium secondary battery including NMC positive electrode material and LFP positive electrode material.

FIG. 3 shows a discharge voltage profile showing a result of measuring open-circuit voltage per state of charge (SOC), while discharging a lithium secondary battery including a blended positive electrode material in a positive electrode, and carbon material in a negative electrode, in which the blended positive electrode material includes NMC positive electrode material and LFP positive electrode material blended at 7:3 (weight ratio).

Referring to FIG. 3, it is shown that the discharge voltage profile of the lithium secondary battery including the blended positive electrode material has a voltage plateau when the open-circuit voltage is close to approximately 3.2 V. Further, the voltage plateau can be observed to be the same, even by measuring the open-circuit voltage per SOC, while charging the lithium secondary battery including the blended positive electrode material including the NMC positive electrode material and the LFP positive electrode material blended at 7:3 (weight ratio). It has already been explained above with reference to FIG. 1 that the concentration of the operating ions reacting with the NMC positive electrode material and the LFP positive electrode material varies according to voltage variation. Accordingly, it is obvious that, even when the charge or discharge voltage profile of the secondary battery including the first and the second positive electrode materials has at least one voltage plateau, the concentration of the operating ions reacting with the first and the second positive electrode materials will vary according to voltage variation, leading into change in the operating voltage ranges of the first and the second positive electrode materials.

Meanwhile, the voltage profile shown in FIG. 3 has a voltage plateau containing a point of inflection, because the type of positive electrode material that mainly reacts with the operating ions changes depending on voltage range or SOC range.

For example, when the blended positive electrode material includes NMC positive electrode material and LFP positive electrode material, it is mainly the LFP positive electrode material that reacts with the operating ions in the low voltage range (below approximately 3.2 V), while it is mainly the NMC positive electrode material that reacts with the operating ions in the high voltage range (approximately 3.2 V or above).

Meanwhile, due to different reaction kinetics of the NMC positive electrode material and the LFP positive electrode material with the operating ions, when the type of positive electrode material mainly reacting with the operating ions changes, then dominant reaction kinetics also changes. Accordingly, by analyzing the voltage variation pattern during charging and discharging of a secondary battery including the blended positive electrode material, a point of inflection is observed in the voltage pattern, as illustrated in FIG. 3.

In the area where the point of inflection is present, even a slight change in the secondary battery voltage results in a large change in the state of charge of the secondary battery. Accordingly, it is difficult to estimate with accuracy the state of charge of the secondary battery by voltage measurement in the voltage range (around 3.2 V) where dominant reaction kinetics of the blended positive electrode material changes. However, the present disclosure is capable of estimating the state of charge with accuracy, even with respect to a secondary battery which includes a blended positive electrode material exhibiting a voltage variation pattern that includes a point of inflection, by using the Extended Kalman Filter defined from a circuit model.

In yet another example, when at least one of the first and the second positive electrode material has a voltage profile that includes a voltage plateau, the concentration of the operating ions reacting with the first and the second positive electrode materials may show a difference according to the voltage of the secondary battery.

Figure 4:
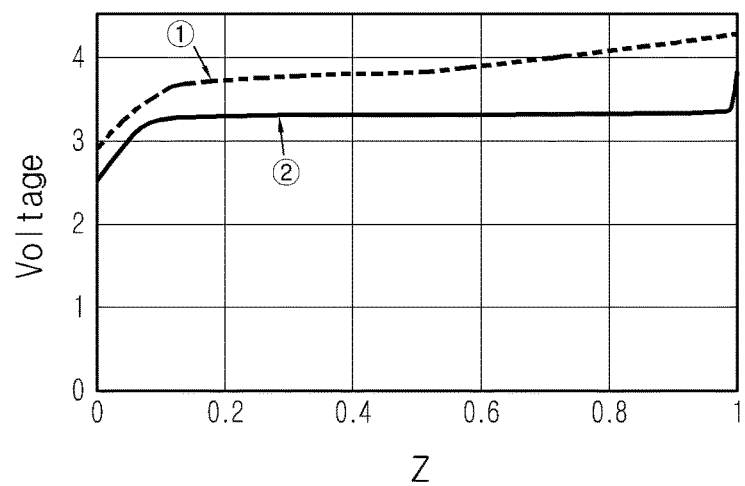
FIG. 4 is a graph of result of measuring voltage variation profile per state of charge of respective half cells, after fabricating a half cell including NMC positive electrode material and lithium metal as the positive electrode and the negative electrode, respectively, and a half cell including LFP positive electrode material and lithium metal as the positive electrode and the negative electrode, respectively.

FIG. 4 is a graph of result of measuring voltage variation profile per state of charge of each of half cells, after fabricating a half cell including NMC positive electrode material and lithium metal as the positive electrode and the negative electrode, respectively, and a half cell including LFP positive electrode material and lithium metal as the positive electrode and the negative electrode, respectively.

In FIG. 4, graph ① represents the voltage profile of a half cell including NMC positive electrode material, and graph ② represents the voltage profile of a half cell including LFP positive electrode material.

Referring to FIG. 4, a voltage plateau is observed in the voltage profile of the half cell including the LFP positive electrode material. This measurement result supports the fact that, when at least one of the first and the second positive electrode materials has a voltage profile that includes a voltage plateau, the concentration of the operating ions reacting with the first and the second positive electrode materials will show a difference according to the voltage of the secondary battery.

According to the present disclosure, a material for use as the first and the second positive electrode materials is not limited to any specific kind. Accordingly, it will be apparent to those with ordinary knowledge in the art that, in addition to the NMC positive electrode material and the LFP positive electrode material, a combination of positive electrode materials that satisfy at least one of the conditions described above may be contemplated for use as the first and the second positive electrode materials.

According to one aspect, the first positive electrode material may be an alkali metal compound expressed by general chemical formula $A[A_xM_y]O_{2+z}$ (where, A includes at least one element of Li, Na or K; M includes at least one element selected from among Ni, Co, Mn, Ca, Mg, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; and x, y, z and stoichiometric coefficients of components contained in M are so selected that the compound maintains electric neutrality).

Optionally, the first positive electrode material may be the alkali metal compound $xLiM^1O_2\text{-}(1\text{-}x)Li_2M^2O_3$ (where, $M^1$ includes at least one element having a mean oxidation state of 3; and $M^2$ includes at least one element having a mean oxidation state of 4; and $0\leq x\leq 1$), as disclosed in U.S. Pat. No. 6,677,082, U.S. Pat. No. 6,680,143, and so on.

According to another aspect, the second positive electrode material may be lithium metal phosphate expressed by general chemical formula $Li_aM^1{}_xFe_{1-x}M^2{}_yP_{1-y}M^3{}_zO_{4-z}$ (where $M^1$ includes at least one element selected from among Ti, Si, Mn, Co, Fe, V, Cr, Mo, Ni, Nd, Mg and Al; $M^2$ includes at least one element selected from among Ti, Si, Mn, Co, Fe, V, Cr, Mo, Ni, Nd, Mg, Al, As, Sb, Si, Ge, V and S; $M^3$ includes one element selected from halogen group optionally including F; $0<a\leq 2$, $0\leq x\leq 1$, $0\leq y<1$, $0\leq z<1$; and a, x, y, z, and stoichiometric coefficient of components contained in $M^1$, $M^2$, and $M^3$ are so selected that the compound maintains electric neutrality), or $Li_3M_2(PO_4)_3$ [where, M includes at least one element selected from among Ti, Si, Mn, Fe, Co, V, Cr, Mo, Ni, Mg and Al].

According to yet another aspect, the first positive electrode material may be $Li[Li_aNi_bCo_cMn_dO_{2+z}]$ ($a\geq 0$; $a+b+c+d=1$; at least one from among b, c and d are not 0; $-0.1\leq z\leq 2$). Further, the second positive electrode material may be one or more selected from the group consisting of $LiFePO_4$, $LiMn_xFe_yPO_4$ ($0<x+y\leq 1$), and $Li_3Fe_2(PO_4)_3$.

According to yet another aspect, the first positive electrode material and/or the second positive electrode material may include a coating layer. The coating layer may include a carbon layer, or may include an oxide layer or a fluoride layer including at least one element selected from the group consisting of Ti, Si, Mn, Co, Fe, V, Cr, Mo, Ni, Nd, Mg, Al, As, Sb, Si, Ge, V and S.

According to the present disclosure, the mixing ratio of the first and the second positive electrode materials may be properly adjusted in consideration of electrochemical design conditions, by taking into consideration a purpose of using the secondary battery that is intended to be fabricated.

According to an embodiment, when a secondary battery with good discharge power is desired, then the positive electrode material with fast reaction speed with lithium ion may be selected as any one of the first and the second positive electrode materials, and the mixing ratio of the selected positive electrode material may be set to be as high as possible. In one example, $Li[Ni_{1/3}Mn_{1/3}Co_{1/3}]O_2$ and $LiFePO_4$ may be selected as the first positive electrode material and the second positive electrode material, respectively, and the mixing ratio of the first positive electrode material and the second positive electrode material may be set to 9:1.

According to another embodiment, when a secondary battery with good high-temperature stability is desired, then the positive electrode material with superior high-temperature stability may be selected as any one of the first and the second positive electrode materials, and the mixing ratio of the selected positive electrode material may be set to be as high as possible. In one example, $Li[Ni_{1/3}Mn_{1/3}CO_{1/3}]O_2$ and $LiFePO_4$ may be selected as the first positive electrode material and the second positive electrode material, respectively, and the mixing ratio of the first positive electrode material and the second positive electrode material may be set to 2:8.

According to yet another embodiment, when a secondary battery with cheaper manufacture cost is desired, then the positive electrode material with lower material cost may be selected as any one of the first and the second positive electrode materials, and the mixing ratio of the selected positive electrode material may be set to be as high as possible. In one example, $Li[Ni_{1/3}Mn_{1/3}CO_{1/3}]O_2$ and $LiFePO_4$ may be selected as the first positive electrode material and the second positive electrode material, respectively, and the mixing ratio of the first positive electrode material and the second positive electrode material may be set to 1:9.

According to yet another embodiment, when a secondary battery with good discharge power and superior high-temperature stability is desired, then a positive electrode material with fast reaction speed with operating ions and a positive electrode material with superior high-temperature stability may be selected as the first and the second positive electrode materials, respectively, and the mixing ratio of the positive electrode materials may be set in consideration of the balance between the discharge power and the high-temperature stability. In one example, $Li[Ni_{1/3}Mn_{1/3}CO_{1/3}]O_2$ and $LiFePO_4$ may be selected as the first positive electrode material and the second positive electrode material, respectively, and the mixing ratio of the first positive electrode material and the second positive electrode material may be set to 4:6.

According to yet another embodiment, when a secondary battery with large capacity per weight is desired, then the positive electrode material with large capacity per weight may be selected as any one of the first and the second positive electrode materials, and the mixing ratio of the selected positive electrode material may be set to be as high as possible. In one example, $Li[Ni_{0.5}Mn_{0.3}CO_{0.2}]O_2$ and $LiFePO_4$ may be selected as the first positive electrode material and the second positive electrode material, respectively, and the mixing ratio of the first positive electrode material and the second positive electrode material may be set to 9:1.

The methods for selecting the first and the second positive electrode materials and adjusting a mixing ratio thereof described above are provided only for illustrative purpose. Accordingly, as will be obviously appreciated by those skilled in the art, the first and the second positive electrode materials may be properly selected and the mixing ratio of the respective positive electrode materials may be properly set, depending on conditions of designing a secondary battery.

Further, the number of positive electrode materials that may be included in the blended positive electrode material is not limited to 2. Further, to enhance the property of the positive electrode material blend, other additives such as, for example, conducting agent, binder, and so on, may be added to the blended positive electrode material without limitation.

According to one embodiment, the blended positive electrode material may include three different positive electrode materials, and an example may include a blended positive electrode material including $LiMn_2O_4$, $Li[Li_aNi_xCo_yMn_zO_2$ [$a\geq 0$; $a+x+y+z=1$; at least one of x, y and z is not 0], and $LiFePO_4$.

According to yet another embodiment, the blended positive electrode material may include four different positive electrode materials, and an example may include a blended positive electrode material including $LiNiO_2$, $LiMn_2O_4$, $Li[Li_aNi_xCo_yMn_zO_2$[$a\geq 0$; $a+x+y+z=1$; at least one of x, y and z is not 0], and $LiFePO_4$.

The secondary battery including the blended positive electrode material may be mounted to various types of electrically-driven apparatuses operable on electrical energy, and the electrically-driven apparatuses are not limited to any specific kind.

According to one aspect, the electrically-driven apparatus may be a mobile computer apparatus such as mobile phone, laptop computer, tablet computer, and so on, or hand-held multimedia apparatus including digital camera, video camera, audio/video playback device, and so on.

According to another aspect, the electrically-driven apparatus may be an electric power apparatus movable by electricity, such as, electric vehicle, hybrid vehicle, electric bicycle, electric motorcycle, electric train, electric boat, electric airplane, and so on, or a power tool including a motor, such as, electric drill, electric grinder, and so on.

According to yet another aspect, the electrically-driven apparatus may be a mass power storage apparatus installed at electrical grids to store renewable energy or surplus generated electricity, or uninterruptable power supply supplying electricity to a variety of information communications apparatus including server computer or mobile communication equipment in the event of emergency such as blackout, and so on.

Figure 5:
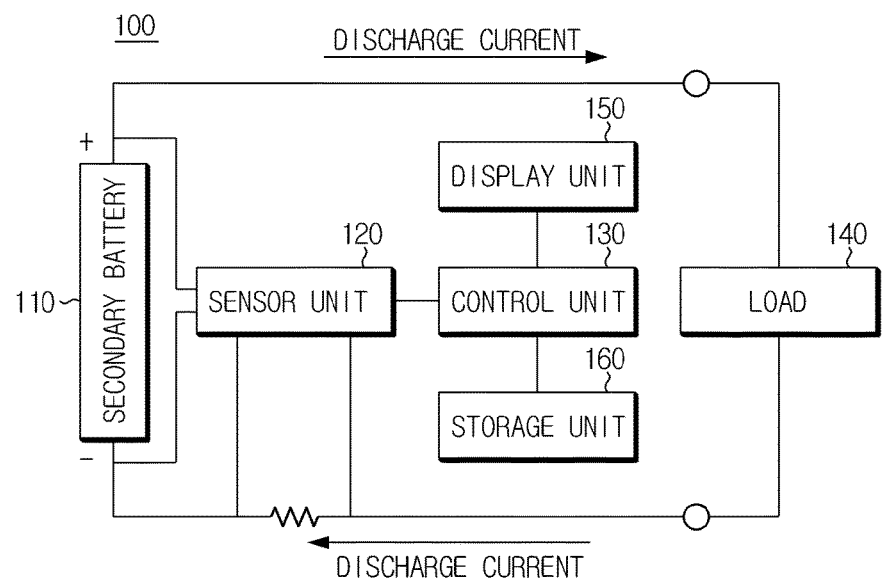
FIG. 5 is a block diagram illustrating a configuration of an apparatus for estimating a state of a secondary battery according to an embodiment of the present disclosure.

FIG. 5 is a block diagram schematically illustrating a configuration of an apparatus 100 for estimating a state of a secondary battery including a blended positive electrode material according to an embodiment of the present disclosure.

As illustrated in the drawing, the apparatus 100 includes a sensor unit 120 and a control unit 130, and is electrically connected with the secondary battery 110 including the blended positive electrode material to estimate the state of the secondary battery 110 using Extended Kalman Filter.

The secondary battery 110 is electrically connected with load 140. The load 140 is included in the variety of electrically-driven apparatuses described above, and it refers to an energy consuming device included in the electrically-driven apparatuses operated on electrical energy supplied during discharging of the secondary battery 110. The load may be, without limitation, a rotary power device such as a motor, a power converting device such as an inverter, and so on, although the present disclosure is not limited to a specific type of the load.

Additionally, the apparatus 100 may optionally further include a storage unit 160. The storage unit 160 is not limited to any specific type of storage medium as long as it can record and erase information. In one example, the storage unit 160 may be RAM, ROM, register, hard disk, optical recording medium, or magnetic recording medium. Further, the storage unit 160 may be connected with the control unit 130 via, for example, data bus, and so on, to allow access by the control unit 130. The storage unit 160 also stores and/or updates and/or erases and/or transmits program including various control logics implemented by the control unit 130 and/or the data that is generated when the control logic is implemented. The storage unit 160 is logically dividable into two or more, and included in the control unit 130 without limitation.

Additionally, the state estimating apparatus 100 may optionally further include a display unit 150. The display unit 150 is not limited to any specific type, as long as it can display information generated by the control unit 130 as graphic interface. In one example, the display unit 150 may be a liquid crystal display, an LED display, an OLED display, an E-INK display, a flexible display, and so on. The display unit 150 may be connected with the control unit 130 directly or indirectly. In the latter case, the display unit 150 may be located at an area physically separated from an area where the control unit 130 is located. Further, a third-party control unit (not illustrated) may be disposed between the display unit 150 and the control unit 130, in which case the third-party control unit may receive from the control unit 130 information to be displayed on the display unit 150 and display the received information on the display unit 150. To this purpose, the third-party control unit and the control unit 130 may be connected via communication interface.

Under control of the control unit 130, the sensor unit 120 repeatedly measures voltages applied between the positive electrode and the negative electrode of the secondary battery 110 and currents flowing in or out of the secondary battery 110 at time intervals, and outputs the measured voltage and current to the control unit 130. The voltage and the current may be measured at the same time point or at different time points.

The sensor unit 120 may include a voltage measuring means and a current measuring means. The voltage measuring means may be configured as a circuit which measures the voltage of the secondary battery 110 based on a reference potential. The current measuring means may be configured as a sense resistor which is installed on a line where a charge current or a discharge current flows. However, the present disclosure is not limited to specific configurations of the voltage measuring means and the current measuring means.

The voltage measuring means and the current measuring means may be included in one sensor unit 120, but may be separated from each other physically. In such example, the sensor unit 120 will have to be understood as a concept that includes a voltage measuring means and a current measuring means separated from each other.

The control unit 130 is a constituent element that can implement at least one or more control logics necessary for estimating the state of the secondary battery 110 using the Extended Kalman Filter algorithm, in non-limiting example, pre-defined as software.

In order to apply the Extended Kalman Filter in the state estimation of the secondary battery, it is necessary to define the state equation and the output equation by considering the secondary battery as one system.

In a preferred embodiment, the state equation and the output equation may be derived from a circuit model. The circuit model may include at least one or more circuit units which are connected in series and/or in parallel to simulate voltage variation of a secondary battery including a blended positive electrode material.

Figure 6:
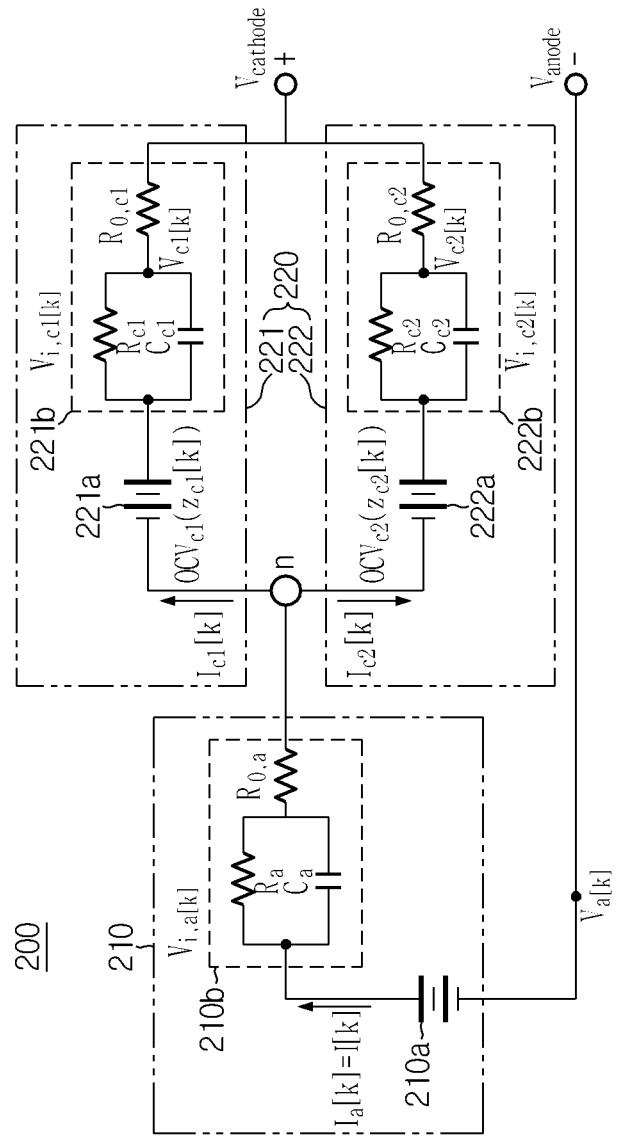
FIG. 6 is a circuit diagram representing a circuit model according to an embodiment of the present disclosure, which may be used to derive a state equation and an output equation of the Extended Kalman Filter.

FIG. 6 illustrates a circuit model 200 according to an embodiment of the present disclosure, from which the state equation and the output equation of the Extended Kalman Filter can be derived.

Referring to FIG. 6, the circuit model 200 includes a first positive electrode material circuit unit 221 and a second positive electrode material circuit unit 222 connected in parallel, and optionally, a negative electrode material circuit unit 210 connected in series with the first and the second positive electrode material circuit units 221, 222.

The negative electrode material circuit unit 210 includes an open-circuit voltage element 210a of the negative electrode material, and an impedance element 210b related with the electrochemical property of the negative electrode material.

When the secondary battery is charged or discharged, voltages each corresponding to $OCV_a(z_a[k])$ and $V_{i,a}[k]$ are formed at both ends of the open-circuit voltage element 210a and the impedance element 210b of the negative electrode material.

The negative electrode material circuit unit 210 is modeled such that the voltage formed at the negative electrode material circuit unit 210 is varied by the state of charge $z_a[k]$ and the impedance element of the negative electrode material.

The state of charge $z_a[k]$ represents the degree of intercalation or de-intercalation of the operating ions into or from the negative electrode material. $z_a[k]$ decreases as the state of charge of the negative electrode material decreases, that is, as the operating ions are de-intercalated from the negative electrode material.

$OCV_a(z_a[k])$ is in an increasing tendency as $z_a[k]$ decreases, and the tendency turns opposite as $z_a[k]$ increases. $OCV_a(z_a[k])$ may be determined after fabricating a half cell with the negative electrode material, by using an open-circuit voltage profile which is obtained as a result of conducting a discharge test while changing the state of charge (i.e., $z_a[k]$) from 1 to 0. The half cell is fabricated with the general method used in the art, to obtain an open-circuit voltage profile of the negative electrode material. The reference electrode of the half cell may preferably be lithium metal.

$OCV_a(z_a[k])$ may be, without limitation, a look-up table which is a tabulated data form of the open-circuit voltage values of each of $z_a[k]$ that construct the open-circuit voltage profile, and may be a look-up function functionalized by way of numerical analysis of the open-circuit voltage profile.

When the total capacity of the operating ions that can be de-intercalated from the negative electrode material is $Q_a$, $z_a[k]$ is the parameter that decreases from 1 upon start of the de-intercalation of the operating ions in proportion to the ratio of the de-intercalated operating ion capacity to $Q_a$, and then becomes 0 when all the operating ions corresponding to the total capacity $Q_a$ are de-intercalated. Accordingly, $z_a[k]$ is the parameter related with the amount of operating ions de-intercalated from the negative electrode material, and it corresponds to the state of charge of the half cell of the negative electrode material mentioned above. Further, since the proportion of the operating ions de-intercalated from the negative electrode material directly corresponds to the state of charge of the secondary battery, $z_a[k]$ may correspond to $z_{cell}[k]$ which is the state of charge of the secondary battery.

The impedance element 210b is provided to circuitally simulate voltages such as IR voltage generated when the current flows through the negative electrode material and polarization voltage generated by the polarization of the negative electrode material, and the impedance element 210b may include at least one circuit element.

The 'IR voltage' as used herein refers to voltage generated by internal resistance of the secondary battery when the secondary battery is charged or discharged.

Due to the IR voltage, the voltage of the secondary battery is higher than the open-circuit voltage during secondary battery charging, and is lower during secondary battery discharging.

The impedance element 210b may include at least one resistor, at least one capacitor, at least one inductor (not illustrated), or a combination thereof. When the impedance element 210b includes a plurality of circuit elements, the circuit elements may be connected with one another in series or in parallel. Meanwhile, when IR voltage and polarization voltage are not generated when the current flows through the secondary battery, the impedance element 210b may be excluded from the circuit model.

In a preferable example, the impedance element 210b includes an RC circuit including a resistor $R_a$ and a capacitor $C_a$ connected in parallel, and optionally, a resistor $R_{0,a}$ connected in series with the RC circuit.

The values of the resistors $R_a$ and $R_{0,a}$, and the capacitor $C_a$ are determined by experiment, at least based on the electrochemical property of the negative electrode material, and on the electrical property of a metal current collector, etc. included in the negative electrode.

The resistor and/or the capacitor included in the impedance element 210b may be omitted. Further, the impedance element 210b may additionally include another circuit element such as an inductor, and may additionally include another resistor, another capacitor, another inductor, or a combination thereof.

$V_{i,a}[k]$ represents the voltage formed at the impedance element 210b, and may be determined using an impedance voltage calculation formula derived from the connection relation among the circuit elements constituting the impedance element 210b, and the electrical characteristic value of the circuit elements. The electrical characteristic value may be any one of resistance value, capacitance value and an inductance value.

The first positive electrode material circuit unit 221 includes an open-circuit voltage element 221a corresponding to the first positive electrode material, and an impedance element 221b of the first positive electrode material.

When the secondary battery is charged or discharged, voltages each corresponding to $OCV_{c1}(z_{c1}[k])$ and $V_{i,c1}[k]$ are formed at both ends of the open-circuit voltage element 221a and the impedance element 221b of the first positive electrode material. Accordingly, the first positive electrode material circuit unit 221 is modeled such that the voltage formed at the first positive electrode material circuit unit 221 is varied by the state of charge $z_{c1}[k]$ and the impedance element of the first positive electrode material.

The state of charge $z_{c1}[k]$ represents the degree of intercalation or de-intercalation of the operating ions into or from the first positive electrode material. Since $z_{c1}[k]$ decreases from 1 to 0 in accordance with the reaction of the operating ions with the first positive electrode material, $OCV_{c1}(z_{c1}[k])$ has a tendency of decreasing with the decrease of $z_{c1}[k]$. $OCV_{c1}(z_{c1}[k])$ may be defined in advance, by fabricating a half cell with the first positive electrode material and measuring the open-circuit voltage profile of the half cell while discharging until the state of charge (i.e., $z_{c1}[k]$) varies from 1 to 0. The half cell is fabricated with the general method used in the art, to obtain an open-circuit voltage profile of the first positive electrode material. The reference electrode of the half cell may preferably be lithium metal.

$OCV_{c1}(z_{c1}[k])$ may be, without limitation, a look-up table which is a tabulated data form of the open-circuit voltage values of each of $z_{c1}[k]$ that construct the open-circuit voltage profile, and may be a look-up function functionalized by way of numerical analysis of the open-circuit voltage profile.

$z_{c1}[k]$ is a parameter in an inverse proportion to the ratio of the capacity of the operating ions intercalated into the first positive electrode material, with reference to the total capacity $Q_{c1}$ of the operating ions that can be intercalated into the first positive electrode material. Accordingly, $z_{c1}[k]$ is the parameter that decreases from 1 with start of intercalation of the operating ions into the first positive electrode material, and becomes 0 when all the operating ions corresponding to the total capacity $Q_{c1}$ are intercalated. That is, $z_{c1}[k]$ is a parameter related with the amount of operating ions reacting with the first positive electrode material, and may be considered to be the parameter that represents the state of charge of the half cell of the first positive electrode material.

The impedance element 221b may include at least one circuit element to circuitally simulate voltages when the current flows through the secondary battery, such as IR voltage generated by the first positive electrode material, polarization voltage generated by the polarization of the first positive electrode material, and so on. The impedance element 221b may include at least one resistor, at least one capacitor, at least one inductor, or a combination thereof. When the impedance element 221b includes a plurality of circuit elements, the circuit elements may be connected with one another in series or in parallel. Meanwhile, when IR voltage, polarization voltage, etc. are not generated by the first positive electrode material when the current flows through the secondary battery, the impedance element 221b may be excluded from the circuit model.

In a preferable example, the impedance element 221b includes an RC circuit including a resistor ($R_{c1}$) and a capacitor ($C_{c1}$) connected in parallel, and optionally, a resistor ($R_{0,c1}$) connected in series with the RC circuit.

The values of the resistors $R_{c1}$ and $R_{0,c1}$, and the capacitor $C_{c1}$ are determined by experiment, at least based on the electrochemical property of the first positive electrode material, and electrical property of a metal current collector, etc. that is included in the positive electrode.

The resistor and/or the capacitor included in the impedance element 221b may be omitted. Further, depending on the electrochemical property of the first positive electrode material, the impedance element 221b may additionally include another circuit element such as an inductor, and may additionally include another resistor, another capacitor, another inductor, or a combination thereof.

$V_{i,c1}[k]$ represents the voltage formed at the impedance element 221b, and may be determined using an impedance voltage calculation formula derived from the connection relation among the circuit elements constituting the impedance element 221b and the electrical characteristic value of the circuit elements. The electrical characteristic value may be any one of resistance value, capacitance value, and an inductance value.

The second positive electrode material circuit unit 222 includes an open-circuit voltage element 222a and an impedance element 222b corresponding to the second positive electrode material.

When the secondary battery is charged or discharged, voltages each corresponding to $OCV_{c2}(z_{c2}[k])$ and $V_{i,c2}[k]$ are formed at both ends of the open-circuit voltage element 222a and the impedance element 222b of the second positive electrode material. Accordingly, the second positive electrode material circuit unit 222 is modeled such that the voltage formed at the second positive electrode material circuit unit 222 is varied by the state of charge $z_{c2}[k]$ and the impedance element 222b of the second positive electrode material.

The state of charge $z_{c2}[k]$ represents the degree of intercalation or de-intercalation of the operating ions into or from the second positive electrode material. Since $z_{c2}[k]$ decreases from 1 to 0 in accordance with the reaction of the operating ions with the second positive electrode material, $OCV_{c2}(z_{c2}[k])$ has a tendency of decreasing with the decrease of $z_{c2}[k]$. $OCV_{c2}(z_{c2}[k])$ may be defined in advance, by fabricating a half cell with the second positive electrode material and measuring the open-circuit voltage profile of the half cell while discharging until the state of charge (i.e., $z_{c2}[k]$) varies from 1 to 0. The half cell is fabricated with the general method used in the art, to obtain an open-circuit voltage profile of the second positive electrode material. The reference electrode of the half cell may preferably be lithium metal.

$OCV_{c2}(z_{c2}[k])$ may be, without limitation, a look-up table which is a tabulated data form of the open-circuit voltage values of each of $z_{c2}[k]$ that construct the open-circuit voltage profile, and may be a look-up function functionalized by way of numerical analysis of the open-circuit voltage profile.

$z_{c2}[k]$ is a parameter in an inverse proportion to the ratio of the capacity of the operating ions intercalated into the second positive electrode material, with reference to the total capacity $Q_{c2}$ of the operating ions that can be intercalated into the second positive electrode material. Accordingly, $z_{c2}[k]$ is the parameter that decreases from 1 with start of intercalation of the operating ions into the second positive electrode material, and becomes 0 when all the operating ions corresponding to the total capacity $Q_{c2}$ are intercalated. That is, $z_{c2}[k]$ is a parameter related with the amount of operating ions reacting with the second positive electrode material, and may be considered to be the parameter that represents the state of charge of the second positive electrode material.

The impedance element 222b may include at least one circuit element to circuitally simulate voltages formed when the current flows through the secondary battery, such as IR voltage generated by the current flowing through the second positive electrode material, polarization voltage generated by the polarization of the second positive electrode material, and so on. The impedance element 222b may include at least one resistor, at least one capacitor, at least one inductor, or a combination thereof. When the impedance element 222b includes a plurality of circuit elements, the circuit elements may be connected with one another in series or in parallel. Meanwhile, when IR voltage, polarization voltage, etc. are not generated by the second positive electrode material when the current flows through the secondary battery, the impedance element 222b may be excluded from the circuit model.

In a preferable example, the impedance element 222b includes an RC circuit including a resistor ($R_{c2}$) and a capacitor ($C_{c2}$) connected in parallel, and optionally, a resistance component ($R_{0,c2}$) connected in series with the RC circuit.

The values of the resistors $R_{c2}$ and $R_{0,c2}$, and the capacitor $C_{c2}$ are determined by experiment, at least based on the electrochemical property of the second positive electrode material and electrical property of a metal current collector, etc. that is included in the positive electrode.

The resistor and/or the capacitor included in the impedance element 222b may be omitted. Further, depending on the electrochemical property of the second positive electrode material, the impedance element 222b may additionally include another circuit element such as an inductor, and may additionally include another resistor, another capacitor, another inductor, or a combination thereof.

$V_{i,c2}[k]$ represents the voltage formed at the impedance element 222b, and may be determined using an impedance voltage calculation formula derived from the connection relation among the circuit elements constituting the impedance element 222b, and the electrical characteristic value of the circuit elements. The electrical characteristic value may be any one of resistance value, capacitance value and an inductance value.

Charging or discharging of the secondary battery gives rise to the migration of the operating ions in the secondary battery, and the migration of the operating ions may be represented as flows of current ($I_a$, $I_{c1}$, $I_{c2}$) in the circuit model 200. Current $I_a$ is substantially identical to current I of the secondary battery.

When the secondary battery is discharged, the operating ions are de-intercalated from the negative electrode material and migrate toward the blended positive electrode material. In this situation, some of the operating ions migrating from the negative electrode to the blended positive electrode move toward the first positive electrode material, while the rest move toward the second positive electrode material. By reflecting such flows of the operating ions into the circuit model 200, it can be considered that some of the current flowing from the negative electrode to the positive electrode is the current $I_{c1}$ flowing toward the first positive electrode material, and the rest is the current $I_{c2}$ flowing toward the second positive electrode material. Such dividing of the current is the phenomenon observed in a parallel circuit. Accordingly, in the circuit model 200, the first positive electrode material circuit unit 221 and the second positive electrode material circuit unit 222 are connected in parallel.

Meanwhile, when the secondary battery is charged, the operating ions are de-intercalated from the blended positive electrode material and migrate toward the negative electrode material. In this case, the operating ions de-intercalated from the first positive electrode material and the second positive electrode material are joined into a single current and migrate toward the negative electrode material together, in which the directions of the currents $I_{c1}$, $I_{c2}$, and $I_a$ are opposite to the illustration. Like the divided current flows described above, the summed current flow is also the phenomenon observed in a parallel circuit. Accordingly, even when the secondary battery is being charged, the circuit model 200, in which the first positive electrode material circuit unit 221 and the second positive electrode material circuit unit 222 are connected in parallel, is valid.

Preferably, the circuit model 200 described above is used for deriving the state equation and the output equation of the Extended Kalman Filter for use in the estimation of the state of a secondary battery including a blended positive electrode material.

The Extended Kalman Filter is a software algorithm that can statistically estimate the state of a dynamic system, by taking into account externally-measurable parameters regarding the system and disturbances of the system.

The 'state of the system' refers to electrochemical parameter with a time-based varying characteristic, and based on assumption that the secondary battery is one system, it may include at least one parameter selected from the group consisting of states of charge of the first positive electrode material, the second positive electrode material, and the negative electrode material, state of charge of the secondary battery, and impedance voltage components derived from each of the electrode materials.

The basic principle of the Extended Kalman Filter described above is already well known in the art, as can be found in the thesis by Gregory L. Plett, titled "Extended Kalman filtering for battery management systems of LiPB-based HEV battery packs Part 1. Background" (Journal of Power Source 134, 2004, 252-261), the disclosure of which is incorporated herein by reference in its entirety.

The present disclosure utilizes the Extended Kalman Filter for the estimation of the state of a secondary battery, and in order to do so, derives the state equation and the output equation from the circuit model described above based on assumption that the secondary battery including the blended positive electrode material is one system.

In the related art of the Extended Kalman Filter, the state equation and the output equation are generalized as expressed by the following equations:

$x_{k+1} = f(x_k, u_k, w_k)$  state equation:

$y_{k+1} = g(x_k, u_k, v_k)$  out equation:

where,
$x_k$ denotes state of system intended to be estimated using Extended Kalman Filter, $u_k$ is an input of the Extended Kalman Filter as a measurable parameter for a system, $w_k$ is a process noise modeling non-measured input which influences the state of the system, $y_k$ is an externally-measurable output from the system, and $v_k$ is a sensor noise modeling inaccuracy of a sensor influencing system output measurement.

As well known, the Extended Kalman Filter as described above can estimate the state $\hat{x}_k^+$ of the system using the state equation and the output equation, by iterating steps ① to ⑥ described below, while incrementing k by 1, starting from 1, every time predetermined time $\Delta t$ elapses. Hereinbelow, steps ① to ⑥ will be called the 'Extended Kalman Filter algorithm'.

$\hat{x}_k^- = f(\hat{x}_{k-1}^+, u_{k-1}, \bar{w}_{k-1})$  ① State estimate time update:

$\Sigma_{\tilde{x},k}^- = \hat{A}_{k-1} \Sigma_{\tilde{x},k-1}^+ \hat{A}_{k-1}^T + \hat{B}_{k-1} \Sigma_{\tilde{w}} \hat{B}_{k-1}^T$  ② Error covariance time update:

$\hat{y}_k = g(\hat{x}_k^-, u_k, \bar{v}_k)$  ③ Output update:

$L_k = \Sigma_{\tilde{x},k}^- \hat{C}_k^T [\hat{C}_k \Sigma_{\tilde{x},k}^- \hat{C}_k^T + \hat{D}_k \Sigma_{\tilde{v}} \hat{D}_k^T]^{-1}$  ④ Kalman gain determination:

$\hat{x}_k^+ = \hat{x}_k^- + L_k [y_k - \hat{y}_k]$  ⑤ State estimate measurement update:

$\Sigma_{\tilde{x},k}^+ = (I - L_k \hat{C}_k) \Sigma_{\tilde{x},k}^-$  ② Error covariance measurement update:

where, $\bar{w}_k$ and $\bar{v}_k$ are zero-mean of covariances $\Sigma_{\tilde{w}}$ and $\Sigma_{\tilde{v}}$ of the process noise and the sensor noise, respectively.

Further, $\hat{A}_k$, $\hat{B}_k$, $\hat{C}_k$ and $\hat{D}_k$ may be determined using partial derivative equations provided below by linearizing the state equation (f) and the output equation (g) with the first-order Taylor-series expansion in each time index k, and when the state (x) and the input (u) are matrices including a plurality of parameters, these may be expressed as the Jacobian matrices.

$$\hat{A}_k = \frac{\partial f}{\partial x}\bigg|_{x=\hat{x}_k^+}$$

$$\hat{B}_k = \frac{\partial f}{\partial u}\bigg|_{u=u_k}$$

$$\hat{C}_k = \frac{\partial g}{\partial x}\bigg|_{x=\hat{x}_k^-}$$

$$\hat{D}_k = \frac{\partial g}{\partial u}\bigg|_{u=u_k}$$

Hereinbelow, the process of driving the state equation and the output equation of the Extended Kalman Filter from the circuit model 200 illustrated in FIG. 6 into a form of time-discrete equation according to an embodiment will be described in greater detail.

First, equations derivable from the circuit models on the side of the positive electrode will be described.

The state of charge ($z_{c1}[k]$) of the first positive electrode material and the state of charge ($z_{c2}[k]$) of the second positive electrode material may be expressed as the time-discrete equations (1), (2) below, by applying ampere counting method.

$$z_{c1}[k+1] = z_{c1}[k] + \frac{I_{c1}[k]}{Q_{c1}} \Delta t \quad (1)$$

$$z_{c2}[k+1] = z_{c2}[k] + \frac{I_{c2}[k]}{Q_{c2}}\Delta t \qquad (2)$$

In Equations (1) and (2), $Q_{c1}$ and $Q_{c2}$ denote total capacity of the operating ions that can be intercalated into the first positive electrode material and the second positive electrode material, respectively. Further, $I_{c1}$ and $I_{c2}$ are currents flowing through the first positive electrode material circuit unit 221 and the second positive electrode material circuit unit 222, respectively. When the secondary battery is being charged, $I_{c1}$ and $I_{c2}$ have positive values. In contrast, when the secondary battery is being discharged, $I_{c1}[k]$ and $I_{c2}[k]$ have negative values.

Further, among the voltages of the terminals on both sides of the RC circuit included in each of the first positive electrode material circuit unit 221 and the second positive electrode material 222, $V_{c1}$ and $V_{c2}$ are defined as the voltages of the terminals located at the positive electrode, in which case the currents $I_{c1}$ and $I_{c2}$ flowing through the first positive electrode material circuit unit 221 and the second positive electrode material 222 and the current I of the secondary battery satisfy the equations below.

$$I_{c1}[k] = \frac{V_{cathode}[k] - V_{c1}[k]}{R_{0,c1}} \qquad (3)$$

$$I_{c2}[k] = \frac{V_{cathode}[k] - V_{c2}[k]}{R_{0,c2}} \qquad (4)$$

$$-I[k] = I_{c1}[k] + I_{c2}[k] \qquad (5)$$

By substituting Equations (3) and (4) related with $I_{c1}$ and $I_{c2}$ to Equation (5), Equation (6) can be obtained regarding $V_{cathode}$ as follows.

$$V_{cathode}[k] = \frac{V_{c1}[k]R_{0,c2} + V_{c2}[k]R_{0,c1} - I[k]R_{0,c1}R_{0,c2}}{R_{0,c1} + R_{0,c2}} \qquad (6)$$

Further, by defining node n as a reference potential and defining the voltage formed between terminals on both sides of the RC circuit included in each of the first positive electrode material circuit unit 221 and the second positive electrode material 222 as $V_{RC,c1}$ and $V_{RC,c2}$, respectively, $V_{c1}$ and $V_{c2}$ defined above may be expressed as Equations (7) and (8) below.

$$V_{c1}[k] = OCV_{c1}(z_{c1}[k]) + V_{RC,c1}[k] \qquad (7)$$

$$V_{c2}[k] = OCV_{c2}(z_{c2}[k]) + V_{RC,c2}[k] \qquad (8)$$

Further, since the voltage components $V_{RC,c1}$ and $V_{RC,c2}$ included in Equations (7) and (8) are voltages formed by the RC circuit, as well known in the art, these may be expressed by the time-discrete equations as below.

$$V_{RC,c1}[k+1] = \qquad (9)$$
$$\exp\left(-\frac{\Delta t}{R_{c1}C_{c1}}\right)V_{RC,c1}[k] + R_{c1}\left(1 - \exp\left(-\frac{\Delta t}{R_{c1}C_{c1}}\right)\right)I_{c1}[k]$$

$$V_{RC,c2}[k+1] = \qquad (10)$$
$$\exp\left(-\frac{\Delta t}{R_{c2}C_{c2}}\right)V_{RC,c2}[k] + R_{c2}\left(1 - \exp\left(-\frac{\Delta t}{R_{c2}C_{c2}}\right)\right)I_{c2}[k]$$

Meanwhile, by applying Equations (6), (7) and (8) to Equations (3) and (4) described previously, the current distribution equation as Equations (3)' and (4)' may be obtained, and it is appreciated that $I_{c1}$ and $I_{c2}$ are determined by the voltage components $OCV_{c1}$ and $OCV_{c2}$ formed by the open-circuit voltage elements, voltage components $V_{RC,c1}$ and $V_{RC,c2}$ formed by the RC circuit, and current I of the secondary battery.

$$I_{c1}[k] = \frac{(OCV_{c2}(z_{c2}[k]) + V_{RC,c2}[k]) - (OCV_{c1}(z_{c1}[k]) + V_{RC,c1}[k]) - I[k]R_{0,c2}}{R_{0,c1} + R_{0,c2}} \qquad (3)'$$

$$I_{c2}[k] = \frac{(OCV_{c1}(z_{c1}[k]) + V_{RC,c1}[k]) - (OCV_{c2}(z_{c2}[k]) + V_{RC,c2}[k]) - I[k]R_{0,c1}}{R_{0,c1} + R_{0,c2}} \qquad (4)'$$

In Equations (3)' and (4)' described above, I[k] is measurable, the voltage components $OCV_{c1}(z_{c1}[k])$ and $OCV_{c2}(z_{c2}[k])$ formed by the open-circuit voltage element may be obtained using $z_{c1}[k]$ and $z_{c2}[k]$ calculated by Equations (1) and (2) and the open-circuit voltage profiles pre-defined based on experiments, and the voltage components $V_{RC,c1}[k]$ and $V_{RC,c2}[k]$ formed by the RC circuit may be determined by establishing initial conditions $V_{RC,c1}[0]$ and $V_{RC,c2}[0]$ and then using Equations (9) and (10).

Meanwhile, in the equations described above, $R_{0,c1}$, $R_{0,c2}$, $R_{c1}$, $R_{c2}$, $C_{c1}$, $C_{c2}$, $Q_{c1}$, $Q_{c2}$ are electrical characteristic values either directly measured by experiments, or can be tuned by the rule of trial and error to minimize state estimation error of the system as estimated by the Extended Kalman Filter, and these may be the fixed values or variable values that vary according to the state of charge or degradation of the secondary battery.

Next, equations derivable from the circuit models on the side of the negative electrode will be described.

First, the state of charge ($z_a[k]$) of the negative electrode material may be expressed as the time-discrete Equation (11) below, by applying ampere counting method.

$$z_a[k+1] = z_a[k] - \frac{I_a[k]}{Q_a}\Delta t \qquad (11)$$
$$= z_a[k] - \frac{I[k]}{Q_a}\Delta t$$

In Equation (11), $Q_a$ denotes the total capacity of the operating ions which can be intercalated into or de-intercalated from the negative electrode material. $I_a$ denotes current flowing through the negative electrode material circuit unit 210, and is same as the current I of the secondary battery. I has a negative value when the secondary battery is being charged, and has a positive value when the secondary battery is being discharged.

Further, by defining node n as the reference potential and defining voltage formed by the RC circuit included in the negative electrode material circuit unit 210 to be $V_{RC,a}$, voltage ($V_{anode}$) of the negative electrode may be expressed as Equation (12) below by the time-discrete equation.

$$V_{anode}[k] = OCV_a(z_a[k]) + V_{RC,a}[k] - I[k]R_{0,a} \qquad (12)$$

Further, in Equation (12), since $V_{RC,a}$ is the voltage formed by the RC circuit, as well known in the art, it may be expressed as Equation (13) by the time-discrete equation.

$$V_{RC,a}[k+1] = \exp\left(-\frac{\Delta t}{R_a C_a}\right) V_{RC,a}[k] + R_a\left(1 - \exp\left(-\frac{\Delta t}{R_a C_a}\right)\right) I[k] \quad (13)$$

In Equation (13), I[k] is measurable, voltage component $OCV_a(z_a[k])$ forming by the open-circuit voltage element may be obtained from $z_a[k]$ calculated by Equation (11) and open-circuit voltage profile pre-defined based on experiments, and voltage component $V_{RC,a}$ may be calculated by establishing initial conditions for voltage component $V_{RC,a}[k]$ formed by the RC circuit and then using Equation (13).

Meanwhile, in the equations described above, $R_{0,a}$, $R_a$, $C_a$, $Q_a$ are electrical characteristic values either directly measured by experiments, or tunable with the rule of trial and error to minimize state estimation error of the system as estimated by the Extended Kalman Filter, and these are fixed values, or the values that vary according to the state of charge of the secondary battery or degradation of the secondary battery.

In a preferred embodiment, Equations (1), (2), (9), (10), (11) and (13) described above are state equations of the Extended Kalman Filter, which may be expressed as Equation (14) below.

$$\begin{bmatrix} z_{c1}[k+1] \\ z_{c2}[k+1] \\ z_a[k+1] \\ V_{RC,c1}[k+1] \\ V_{RC,c2}[k+1] \\ V_{RC,a}[k+1] \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & E_{c1} & 0 & 0 \\ 0 & 0 & 0 & 0 & E_{c2} & 0 \\ 0 & 0 & 0 & 0 & 0 & E_a \end{bmatrix} \begin{bmatrix} z_{c1}[k] \\ z_{c2}[k] \\ z_a[k] \\ V_{RC,c1}[k] \\ V_{RC,c2}[k] \\ V_{RC,a}[k] \end{bmatrix} + \quad (14)$$

$$\left\{ \begin{bmatrix} \frac{\Delta t}{Q_{c1}} & 0 \\ 0 & \frac{\Delta t}{Q_{c2}} \\ \frac{\Delta t}{Q_{cell}} & \frac{\Delta t}{Q_{cell}} \\ R_{c1}^* & 0 \\ 0 & R_{c2}^* \\ R_a^* & R_a^* \end{bmatrix} \left( \begin{bmatrix} I_{c1}[k] \\ I_{c2}[k] \end{bmatrix} + \begin{bmatrix} w_{c1}[k] \\ w_{c2}[k] \end{bmatrix} \right) \right\}$$

In Equation (14), $z_{c1}[k]$, $z_{c2}[k]$ and $z_a[k]$ are values calculated by Equations (1), (2) and (11), respectively. $E_{c1}$, $E_{c2}$ and $E_a$ each denote $$\exp\left(-\frac{\Delta t}{R_{c1} C_{c1}}\right),$$

$$\exp\left(-\frac{\Delta t}{R_{c2} C_{c2}}\right) \text{ and }$$

$$\exp\left(-\frac{\Delta t}{R_a C_a}\right).$$

$R_{c1}^*$, $R_{c2}^*$, and $R_a^*$ denote $R_{c1}(1-E_{c1})$, $R_{c2}(1-E_a)$ and $R_a(1-E_a)$, respectively. [k] and $I_{c2}[k]$ are determined by Equations (3)' and (4)' which correspond to current distribution equations. $V_{RC,c1}[k]$, $V_{RC,c2}[k]$ and $V_{RC,a}[k]$ are determined by Equations (9), (10) and (13), respectively. $Q_{cell}$ denotes total capacity of the secondary battery and this is previously determined by experiments. $w_{c1}[k]$ and $w_{c2}[k]$ correspond to the process noise, and are parameters related with errors which are caused due to absence of consideration of the error of the sensor unit 120 used for determining I[k] and other factors that may influence the state of the system. The process noise is the value tuned in consideration of the accuracy and sensitivity of the Extended Kalman Filter, and it is a constant value or a variable value.

Referring to Equation (14), the state $x_k$ of the state equation includes six (6) parameters. That is, the state $x_k$ includes, as the state parameters, parameters $z_{c1}[k]$, $z_{c2}[k]$ and $z_a[k]$ representing the states of charge of the first positive electrode material, the second positive electrode material, and the negative electrode material, and voltage components $V_{RC,c1}[k]$, $V_{RC,c2}[k]$ and $V_{RC,a}[k]$ of the RC circuit included in the first positive electrode material circuit unit 221, the second positive electrode material circuit unit 222, and the negative electrode material circuit unit 210. Further, referring to the state equation, input $u_k$ denotes input parameter which includes $I_{c1}[k]$ and $I_{c2}[k]$ calculated at least by Equations (3)' and Equation (4)'. Of course, it is obvious that input $u_k$ may additionally include other parameters.

Meanwhile, in deriving the state equation, certain state parameters may be excluded. In one example, the state of charge $z_a[k]$ of the negative electrode material, and the voltage component $V_{RC,a}[k]$ of the RC circuit included in the negative electrode material circuit unit 210 may be excluded from the state parameters. Further, when impedance element of certain electrode material is negligible, parameters associated with the impedance element of the corresponding electrode material may also be excluded from the state parameters. Further, when a certain parameter is dependent on other parameters, the certain parameter may also be excluded from the state parameters. Further, when a certain parameter can be incorporated as a part of another parameter, then the certain parameter may also be excluded from the state parameters. As described, because the dimension of the state equation decreases when the number of state parameters decreases, computation of the Extended Kalman Filter algorithm is simplified, and accordingly, filter tuning is facilitated. It is apparent that, to the contrary to the embodiment described above, the state parameters may additionally include more parameters.

Next, the output equation of the Extended Kalman Filter will be described. According to an embodiment, output $y_k$ of the Extended Kalman Filter may be defined as the voltage of the secondary battery. In this case, the output equation of the Extended Kalman Filter may be expressed as Equation (15) below.

$$V_{cell}[k] = V_{cathode}[k] - V_{anode}[k] + v[k] \quad (15)$$

$V_{cathode}[k]$ may be determined by Equations (6), (7) and (8), and $V_{anode}[k]$ may be determined by Equation (12). Accordingly, Equation (15) may be arranged as Equation (15)' below.

$$V_{cell}[k] = V_{cathode}[k] - V_{anode}[k] + v[k] \quad (15)'$$

$$= \left(\frac{V_{c1}[k]R_{0,c2} + V_{c2}[k]R_{0,c1} - I[k]R_{0,c1}R_{0,c2}}{R_{0,c1} + R_{0,c2}}\right) -$$

$$(V_a[k] - I[k]R_{0,a}) + v[k]$$

$$= \frac{(OCV_{c1}(z_{c1}[k]) + V_{RC,c1}[k])R_{0,c2} +}{R_{0,c1} + R_{0,c2}} -$$

$$((OCV_a(z_a[k]) + V_{RC,a}[k]) - I[k]R_{0,a}) + v[k]$$

In Equation (15)', I[k] is the current of the secondary battery and it is a measurable value. Referring to Equation (5), I[k] can be expressed by $I_{c1}[k]$ and $I_{c2}[k]$, and therefore, it substantially corresponds to the input of the Extended Kalman Filter. v[k] corresponds to the sensor noise accompanied in the process of measuring current and/or voltage of the secondary battery, and it may be tuned to a fixed value, or a variable value in consideration of accuracy and sensitivity of the Extended Kalman Filter.

In Equation (15)', resistance parameters may be measured by experiments or tuned. Further, the voltage component formed by the open-circuit voltage element may possibly be calculated from a known open-circuit voltage profile. Further, the voltage component formed by the RC circuit may be determined by Equations (9), (10) and (13) described above.

Preferably, the state equation and the output equation as defined by Equations (14) and (15)' are used to determine Jacobian matrices $\hat{A}_k$, $\hat{B}_k$, $\hat{C}_k$ and $\hat{D}_k$ which are used for implementing the Extended Kalman Filter algorithm.

The Jacobian matrices $\hat{A}_k$, $\hat{B}_k$, $\hat{C}_k$ and $\hat{D}_k$ may be determined as described below by the partial derivative operations, and the terms included in each matrix may be calculated by the equations described above or by the electrical characteristic values of the circuit elements included in the circuit model.

excluding some of the state parameters as previously mentioned.

In one embodiment, the state of charge of the negative electrode material is the same as the state of charge of the secondary battery, and the state of charge of the secondary battery can be calculated by the equations below based on the states of charge of the first positive electrode material and the second positive electrode material. Accordingly, the state of charge $z_a[k]$ of the negative electrode material can be excluded from the state equation.

$$z_a[k] = z_{cell}[k] = \alpha z_{c1}[k] + \beta z_{c2}[k]$$

Referring to the equations provided above, $\alpha$ and $\beta$ denote ratios of the capacities of the first positive electrode material and the second positive electrode material with respect to the total capacity of the secondary battery. For example, when the capacities of the first positive electrode material and the second positive electrode material are 20% and 80% of the total capacity, $\alpha$ and $\beta$ are 0.2 and 0.8, respectively.

Further, from the circuit perspective, the impedance element 210b included in the negative electrode material circuit unit 210 may properly reflect to the impedance element 221b of the first positive electrode material circuit unit 221 and the impedance element 222b of the second positive electrode material circuit unit 222. Accordingly, the voltage component $V_{RC,a}[k]$ formed by the RC circuit included in the $$\hat{A}_k = \begin{bmatrix} 1 - \dfrac{\Delta t\, OCV'_{c1}(z_{c1}[k])}{Q_{c1}(R_{0,c1}+R_{0,c2})} & \dfrac{\Delta t\, OCV'_{c2}(z_{c2}[k])}{Q_{c1}(R_{0,c1}+R_{0,c2})} & 0 & -\dfrac{\Delta t}{Q_{c1}(R_{0,c1}+R_{0,c2})} & \dfrac{\Delta t}{Q_{c1}(R_{0,c1}+R_{0,c2})} & 0 \\ \dfrac{\Delta t\, OCV'_{c1}(z_{c1}[k])}{Q_{c2}(R_{0,c1}+R_{0,c2})} & 1 - \dfrac{\Delta t\, OCV'_{c2}(z_{c2}[k])}{Q_{c2}(R_{0,c1}+R_{0,c2})} & 0 & \dfrac{\Delta t}{Q_{c2}(R_{0,c1}+R_{0,c2})} & -\dfrac{\Delta t}{Q_{c2}(R_{0,c1}+R_{0,c2})} & 0 \\ 0 & 0 & 1 & 0 & 0 & 0 \\ -R_{c1*}\dfrac{OCV'_{c1}(z_{c1}[k])}{R_{0,c1}+R_{0,c2}} & R_{c1*}\dfrac{OCV'_{c2}(z_{c2}[k])}{R_{0,c1}+R_{0,c2}} & 0 & E_{c1} - \dfrac{R_{c1*}}{R_{0,c1}+R_{0,c2}} & -\dfrac{R_{c1*}}{R_{0,c1}+R_{0,c2}} & 0 \\ R_{c2*}\dfrac{OCV'_{c1}(z_{c1}[k])}{R_{0,c1}+R_{0,c2}} & -R_{c2*}\dfrac{OCV'_{c2}(z_{c2}[k])}{R_{0,c1}+R_{0,c2}} & 0 & \dfrac{R_{c2*}}{R_{0,c1}+R_{0,c2}} & E_{c2} - \dfrac{R_{c2*}}{R_{0,c1}+R_{0,c2}} & 0 \\ 0 & 0 & 0 & 0 & 0 & E_a \end{bmatrix}$$

$$\hat{B}_k = \begin{bmatrix} \dfrac{\Delta t}{Q_{c1}} & 0 \\ 0 & \dfrac{\Delta t}{Q_{c2}} \\ \dfrac{\Delta t}{Q_{cell}} & \dfrac{\Delta t}{Q_{cell}} \\ R_{c1*} & 0 \\ 0 & R_{c2*} \\ R_{a*} & R_{a*} \end{bmatrix}$$

$$\hat{C}_k = \begin{bmatrix} \dfrac{R_{0,c2}\, OCV'_{c1}(z_{c1}[k])}{R_{0,c1}+R_{0,c2}} & \dfrac{R_{0,c1}\, OCV'_{c2}(z_{c2}[k])}{R_{0,c1}+R_{0,c2}} & -OCV'_a(z_a[k]) & \dfrac{R_{0,c2}}{R_{0,c1}+R_{0,c2}} & \dfrac{R_{0,c1}}{R_{0,c1}+R_{0,c2}} & -1 \end{bmatrix}$$

$$\hat{D}_k = 1$$

In the equations described above, $OCV'_{c1}(z_{c1}[k])$, $OCV'_{c2}(z_{c2}[k])$ and $OCV'_a(z_a[k])$ correspond to first derivatives of $OCV_{c1}(z_{c1}[k])$ $OCV_{c2}(z_{c2}[k])$ and $OCV_a(z_a[k])$, respectively.

The state equation and/or output equation of the Extended Kalman Filter described above may be modified by partially negative electrode material circuit unit 210 may also be excluded from the state equation of the Extended Kalman Filter.

In the example described above, the state equation, and the Jacobian matrices $\hat{A}_k$, $\hat{B}_k$, $\hat{C}_k$ and $\hat{D}_k$ of the Extended Kalman Filter may be modified as equations below, and the output equation may be maintained identical.

$$\begin{bmatrix} z_{c1}[k+1] \\ z_{c2}[k+1] \\ V_{RC,c1}[k+1] \\ V_{RC,c2}[k+1] \end{bmatrix} = \begin{bmatrix} 1 & 0 & 0 & 0 \\ 0 & 1 & 0 & 0 \\ 0 & 0 & E_{c1} & 0 \\ 0 & 0 & 0 & E_{c2} \end{bmatrix} \begin{bmatrix} z_{c1}[k] \\ z_{c2}[k] \\ V_{RC,c1}[k] \\ V_{RC,c2}[k] \end{bmatrix} + \left\{ \begin{bmatrix} \frac{\Delta t}{Q_{c1}} & 0 \\ 0 & \frac{\Delta t}{Q_{c2}} \\ R_{c1^*} & 0 \\ 0 & R_{c2^*} \end{bmatrix} \left( \begin{bmatrix} I_{c1}[k] \\ I_{c2}[k] \end{bmatrix} + \begin{bmatrix} w_{c1}[k] \\ w_{c2}[k] \end{bmatrix} \right) \right\}$$

$$\hat{A}_k = \begin{bmatrix} 1 - \frac{\Delta t OCV'_{c1}(z_{c1}[k])}{Q_{c1}(R_{0,c1}+R_{0,c2})} & \frac{\Delta t OCV'_{c2}(z_{c2}[k])}{Q_{c1}(R_{0,c1}+R_{0,c2})} & -\frac{\Delta t}{Q_{c1}(R_{0,c1}+R_{0,c2})} & \frac{\Delta t}{Q_{c1}(R_{0,c1}+R_{0,c2})} \\ \frac{\Delta t OCV'_{c1}(z_{c1}[k])}{Q_{c2}(R_{0,c1}+R_{0,c2})} & 1 - \frac{\Delta t OCV'_{c2}(z_{c2}[k])}{Q_{c2}(R_{0,c1}+R_{0,c2})} & \frac{\Delta t}{Q_{c2}(R_{0,c1}+R_{0,c2})} & -\frac{\Delta t}{Q_{c2}(R_{0,c1}+R_{0,c2})} \\ -R_{c1^*} \frac{OCV'_{c1}(z_{c1}[k])}{R_{0,c1}+R_{0,c2}} & R_{c1^*} \frac{OCV'_{c2}(z_{c2}[k])}{R_{0,c1}+R_{0,c2}} & E_{c1} - \frac{R_{c1^*}}{R_{0,c1}+R_{0,c2}} & -\frac{R_{c1^*}}{R_{0,c1}+R_{0,c2}} \\ R_{c2^*} \frac{OCV'_{c1}(z_{c1}[k])}{R_{0,c1}+R_{0,c2}} & -R_{c2^*} \frac{OCV'_{c2}(z_{c2}[k])}{R_{0,c1}+R_{0,c2}} & \frac{R_{c2^*}}{R_{0,c1}+R_{0,c2}} & E_{c2} - \frac{R_{c2^*}}{R_{0,c1}+R_{0,c2}} \end{bmatrix}$$

$$\hat{B}_k = \begin{bmatrix} \frac{\Delta t}{Q_{c1}} & 0 \\ 0 & \frac{\Delta t}{Q_{c2}} \\ R_{c1^*} & 0 \\ 0 & R_{c2^*} \end{bmatrix}$$

$$\hat{C}_k = \begin{bmatrix} \frac{R_{0,c2} OCV'_{c1}(z_{c1}[k])}{R_{0,c1}+R_{0,c2}} & \frac{R_{0,c1} OCV'_{c2}(z_{c2}[k])}{R_{0,c1}+R_{0,c2}} & \frac{R_{0,c2}}{R_{0,c1}+R_{0,c2}} & \frac{R_{0,c1}}{R_{0,c1}+R_{0,c2}} \end{bmatrix}$$

$$\hat{D}_k = 1$$

Meanwhile, in order to implement the Extended Kalman Filter algorithm, it is necessary to set initial conditions of the respective state parameters included in the state. The initial conditions of the state parameter are preferably set so that the Extended Kalman Filter follows the actual state of the system efficiently.

Since the Extended Kalman Filter has robustness against the initial condition, the initial conditions do not have to be limited to any specific conditions. Accordingly, the initial conditions of the state parameters may be set arbitrarily to satisfy the condition that the state of the system estimated by the Extended Kalman Filter is not diverged.

Preferably, the initial conditions of the state parameters may be set as follows.

$V_{RC,c1}[0]=0$
$V_{RC,c2}[0]=0$
$V_{RC,a}[0]=0$
  $z_{cell}[0]=OCV_{cell}^{-1}(V_{cell}[0])$
  $z_a[0]=z_{cell}[0]$
  $z_{c1}[0]=OCV_{c1}^{-1}(V_{Cell}[0]+OCV_a(z_a[0]))$
  $z_{c2}[0]=OCV_{c2}^{-1}(V_{Cell}[0]+OCV_a(z_a[0]))$ Referring to the initial conditions of the state parameters, $V_{cell}[0]$ is the voltage of the secondary battery initially measured at the beginning of the charging or discharging of the secondary battery, and approximately, this corresponds to the open-circuit voltage at the time of beginning charging or discharging of the secondary battery. An operator $OCV_{cell}^{-1}$ is an inverse transform operator of an operator $OCV_{cell}(z_{cell}[k])$ that transforms the state of charge of the secondary battery into the open-circuit voltage, and it may be determined based on the open-circuit voltage profile which is previously obtained by charging and discharging experiment of the secondary battery. For a half cell including the first positive electrode material, an operator $OCV_{c1}^{-1}$ is an inverse transform operator of an operator $OCV_{c1}(z_{c1}[k])$ that transforms the state of charge of the first positive electrode material into the open-circuit voltage of the corresponding half cell, and it may be determined based on the open-circuit voltage profile which is previously obtained by charging and discharging experiment of the half cell. An operator $OCV_{c2}^{-1}$ is an inverse transform operator of an operator $OCV_{c1}(z_{c1}[k])$ that transforms the state of charge of the second positive electrode material of a half cell including the second positive electrode material into the open-circuit voltage, and it may be determined based on the open-circuit voltage profile which is previously obtained by charging and discharging experiment of the half cell. For a half cell including the negative electrode material, an operator $OCV_a$ transforms the state of charge of the negative electrode material into the open-circuit voltage of the corresponding half cell, and it may be determined based on the open-circuit voltage profile which is previously obtained by charging and discharging experiment of the corresponding half cell. In one embodiment, the open-circuit voltage profiles may be defined in look-up table or look-up function forms, although embodiments are not limited thereto.

Figure 7:
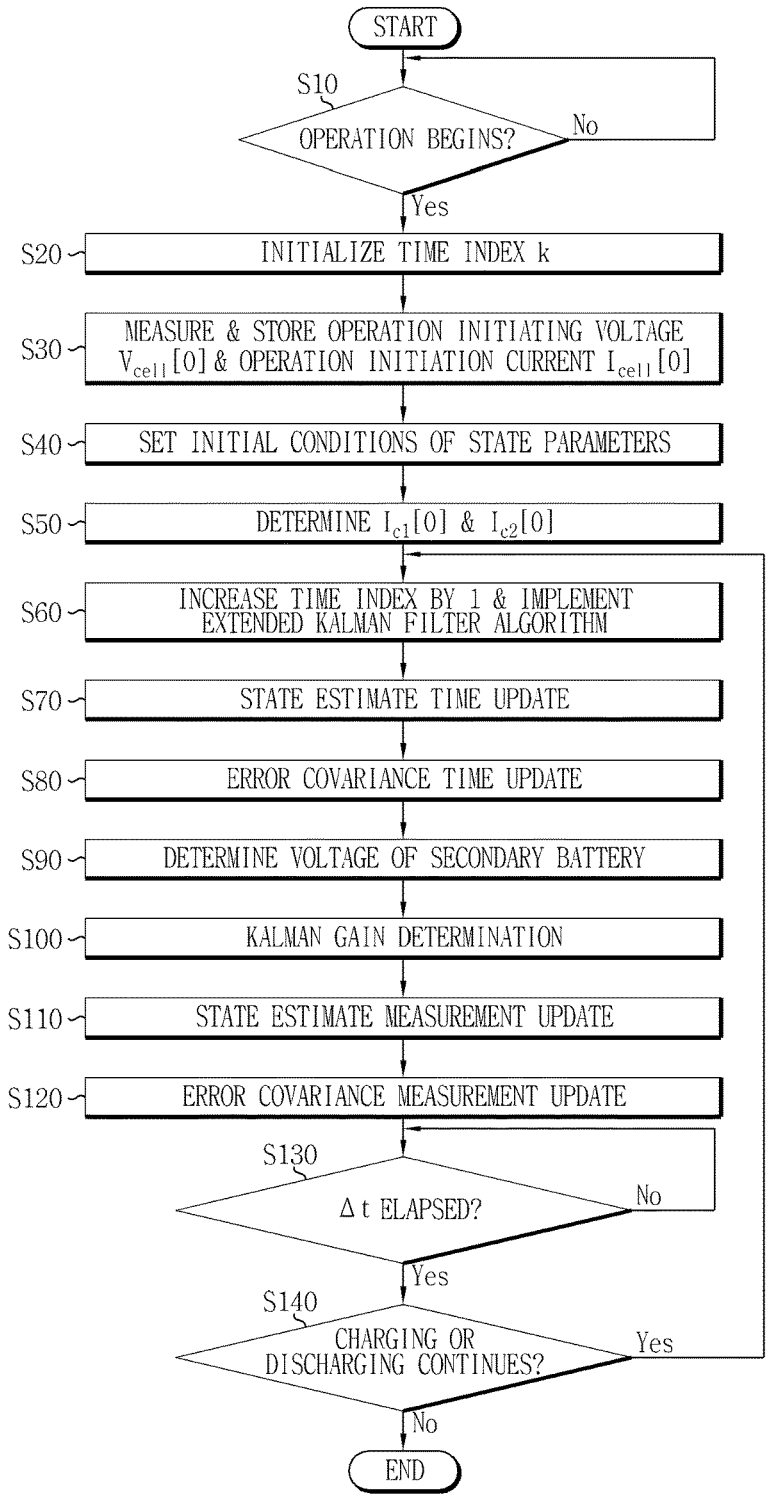
FIG. 7 is a sequence diagram illustrating, in sequence, a method for estimating a state of a secondary battery by implementing an extended Kalman algorithm according to an embodiment of the present disclosure.

Hereinbelow, referring to FIG. 7, a method of the control unit 130 for estimating a state of a secondary battery with the start of secondary battery charging or discharging and at time intervals $\Delta t$, by iterating the Extended Kalman Filter algorithm using the state equation and the output equation, will be described in detail.

First, at S10, the control unit 130 determines whether or not the operation (i.e., charging or discharging) of the secondary battery begins, by monitoring through the sensor unit 120 the direction and magnitude of the current flowing through the secondary battery 110.

When determining that the operation of the secondary battery 110 begins, at S20, the control unit 130 initializes time index k to 0.

Next, at S30, the control unit 130 measures, through the sensor unit 120, $V_{cell}[0]$ corresponding to the initial operation voltage of the secondary battery 110 and $I_{cell}[0]$ corresponding to initial operation current and stores the same in the storage unit 160.

After measuring and storing of $V_{cell}[0]$ and $I_{cell}[0]$, at S40, the control unit 130 sets the initial conditions for the state parameters of the system as follows.

$\hat{V}_{RC,c1}^{+}[0]=0$
$\hat{V}_{RC,c2}^{+}[0]=0$
$\hat{V}_{RC,a}^{+}[0]=0$
$\hat{z}_{a}^{+}[0]=z_{cell}[0]=OCV_{cell}^{-1}(V_{cell}[0])$
$\hat{z}_{c1}^{+}[0]=OCV_{c1}^{-1}(V_{Cell}[0]+OCV_{a}(z_{a}[0]))$
$\hat{z}_{c2}^{+}[0]=OCV_{c2}^{-1}(V_{Cell}[0]+OCV_{a}(z_{a}[0]))$ Next, at S50, the control unit 130 determines $I_{c1}[0]$ and $I_{c2}[0]$ using Equations (3)' and (4)'.

When determining of $I_{c1}[0]$ and $I_{c2}[0]$ is completed, at S60, the control unit 130 increases time index k by 1, and performs the six steps of the Extended Kalman Filter algorithm in order.

First, at S70, the control unit 130 performs the state estimate time update as represented below, by using the initial conditions of the state parameters and $I_{c1}[0]$ and $I_{c2}[0]$.

$$\begin{bmatrix} \hat{z}_{c1}^{-}[1] \\ \hat{z}_{c2}^{-}[1] \\ \hat{z}_{a}^{-}[1] \\ \hat{V}_{RC,c1}^{-}[1] \\ \hat{V}_{RC,c2}^{-}[1] \\ \hat{V}_{RC,a}^{-}[1] \end{bmatrix} = \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & E_{c1} & 0 & 0 \\ 0 & 0 & 0 & 0 & E_{c2} & 0 \\ 0 & 0 & 0 & 0 & 0 & E_{a} \end{bmatrix} \begin{bmatrix} \hat{z}_{c1}^{+}[0] \\ \hat{z}_{c2}^{+}[0] \\ \hat{z}_{a}^{+}[0] \\ \hat{V}_{RC,c1}^{+}[0] \\ \hat{V}_{RC,c2}^{+}[0] \\ \hat{V}_{RC,a}^{+}[0] \end{bmatrix} +$$

$$\left\{ \begin{bmatrix} \frac{\Delta t}{Q_{c1}} & 0 \\ 0 & \frac{\Delta t}{Q_{c2}} \\ \frac{\Delta t}{Q_{cell}} & \frac{\Delta t}{Q_{cell}} \\ R_{c1*} & 0 \\ 0 & R_{c2*} \\ R_{a*} & R_{a*} \end{bmatrix} \right\} \left( \begin{bmatrix} I_{c1}[0] \\ I_{c2}[0] \end{bmatrix} + \begin{bmatrix} w_{c1}[0] \\ w_{c2}[0] \end{bmatrix} \right)$$

Alternatively, the state estimate time update at S70 may be performed by using the following equation.

$$\begin{bmatrix} \hat{z}_{c1}^{-}[1] \\ \hat{z}_{c2}^{-}[1] \\ \hat{V}_{RC,c1}^{-}[1] \\ \hat{V}_{RC,c2}^{-}[1] \end{bmatrix} = \begin{bmatrix} 1 & 0 & 0 & 0 \\ 0 & 1 & 0 & 0 \\ 0 & 0 & E_{c1} & 0 \\ 0 & 0 & 0 & E_{c2} \end{bmatrix} \begin{bmatrix} \hat{z}_{c1}^{+}[0] \\ \hat{z}_{c2}^{+}[0] \\ \hat{V}_{RC,c1}^{+}[0] \\ \hat{V}_{RC,c2}^{+}[0] \end{bmatrix} +$$

$$\left\{ \begin{bmatrix} \frac{\Delta t}{Q_{c1}} & 0 \\ 0 & \frac{\Delta t}{Q_{c2}} \\ R_{c1*} & 0 \\ 0 & R_{c2*} \end{bmatrix} \right\} \left( \begin{bmatrix} I_{c1}[0] \\ I_{c2}[0] \end{bmatrix} + \begin{bmatrix} w_{c1}[0] \\ w_{c2}[0] \end{bmatrix} \right)$$

Of course, when the state parameter is adjusted, it is apparent that the equation used in the state estimate time update will also be modified.

Second, at S80, the control unit 130 performs the error covariance time update of the state using the following equation.

$\Sigma_{\tilde{x},1}^{-} = \hat{A}_{0} \Sigma_{\tilde{x},0}^{+} \hat{A}_{0}^{T} + \hat{B}_{0} \Sigma_{\tilde{w}} \hat{B}_{0}^{T}$ In the above equation, the Jacobian matrices $\hat{A}_{0}$ and $\hat{B}_{0}$ may be determined by using the initial condition of the state parameter, pre-determined electrical characteristic values, and open-circuit voltage profiles. When the state equation is adjusted, the Jacobian matrices are correspondingly modified. The initial condition $\Sigma_{\tilde{x},0}^{+}$ for the error covariance of the state and the error covariance $\Sigma_{\tilde{w}}$ of the process noise may be tuned by the rule of trial and error.

In one embodiment, $\Sigma_{\tilde{w}}$ may be represented by the following equation, and diagonal components may be tuned into proper value by the rule of trial and error.

$$\Sigma_{\tilde{w}} = \begin{bmatrix} \sigma_{I_{c1}}^{2} & 0 \\ 0 & \sigma_{I_{c2}}^{2} \end{bmatrix}$$

Third, at S90, the control unit 130 measures through the sensor unit 120 the current $I[1]$ of the secondary battery, and updates the input of the system into $u_1$ by updating the first current and the second current into $I_{c1}[1]$ and $I_{c2}[1]$ respectively with the current $I[1]$, and estimates the voltage of the secondary battery corresponding to an output of the system, by using output equation (15)', the time-updated state parameter and the measured current $I[1]$ of the secondary battery.

$\hat{V}_{cell}^{+}[1] = V_{cathode}[1] - V_{anode}[1] + v[1]$ $= \frac{(OCV_{c1}(\hat{z}_{c1}^{-}[1]) + \hat{V}_{RC,c1}^{-}[1])R_{0,c2} + (OCV_{c2}(\hat{z}_{c2}^{-}[1]) + \hat{V}_{RC,c2}^{-}[1])R_{0,c1} - I[1]R_{0,c1}R_{0,c2}}{R_{0,c1} + R_{0,c2}} -$ $((OCV_{a}(\hat{z}_{a}^{-}[1]) + \hat{V}_{RC,a}^{-}[1]) - I[1]R_{0,a}) + v[1]$ In the above equation, $v[1]$ is a sensor noise tuned by the rule of trial and error, and it may be set as a fixed value or a variable value.

Fourth, at S100, the control unit 130 calculates Kalman gain using the following equation.

$L_1 = \Sigma_{\tilde{x},1}^{-} \hat{C}_1^{T} [\hat{C}_1 \Sigma_{\tilde{x},1}^{-} \hat{C}_1^{T} + \hat{D}_1 \Sigma_{\tilde{v}} \hat{D}_1^{T}]^{-1}$ In the above equation, the Jacobian matrices $\hat{C}_1$ and $\hat{D}_1$ may be determined by using the initial condition of the state parameter, pre-determined electrical characteristic values, and pre-defined open-circuit voltage profiles. When the output equation is adjusted, it is apparent that the Jacobian matrices will also be correspondingly modified. Further, $\Sigma_{\tilde{x},1}^{-}$ is time-updated error covariance which is determined at the second step. The error covariance $\Sigma_{\tilde{v}}$ of the sensor noise may be tuned by the rule of trial and error.

In one embodiment, $\Sigma_{\tilde{v}}$ may be represented by the following equation, and $\sigma_{\tilde{v}}^{2}$ is tunable to a proper value by the rule of trial and error.

$\Sigma_{\tilde{v}} = (\sigma_{\tilde{v}}^{2})$

Fifth, at S110, the control unit 130 performs the state estimate measurement update, by using the following equation. To this purpose, the control unit 130 performs state estimate measurement update by measuring, through the sensor unit 120, the voltage $V_{cell}[1]$ of the secondary battery, multiplying a difference between the measured voltage and the voltage $\hat{V}_{cell}^+[1]$ estimated to be an output of the system at the third step, by the Kalman gain $L_1$ determined at the fourth step, and adding the result to the state estimate time update determined at the first step.

$$\begin{bmatrix} \hat{z}_{c1}^+[1] \\ \hat{z}_{c2}^+[1] \\ \hat{z}_a^+[1] \\ \hat{V}_{RC,c1}^+[1] \\ \hat{V}_{RC,c2}^+[1] \\ \hat{V}_{RC,a}^+[1] \end{bmatrix} = \begin{bmatrix} \hat{z}_{c1}^-[1] \\ \hat{z}_{c2}^-[1] \\ \hat{z}_a^-[1] \\ \hat{V}_{RC,c1}^-[1] \\ \hat{V}_{RC,c2}^-[1] \\ \hat{V}_{RC,a}^-[1] \end{bmatrix} + L_1\left(V_{cell}[1] - \hat{V}_{cell}^+[1]\right)$$

The equation used for the state estimate measurement update may be modified according to change in the state parameter. For example, when $z_a[k]$ and $V_{RC,a}[k]$ are excluded from the state parameters, related terms are excluded from the matrix included in the equation. As a result, the dimension of the matrix may be adjusted. However, the present disclosure is not limited thereto.

Lastly, at S120, the control unit 130 performs error covariance measurement update using the following equation. The terms on the right side of the following equation are all determined at the steps described above, and I corresponds to the unit matrix.

$$\Sigma_{\tilde{x},1}^+ = (I - L_1 \hat{C}_1) \Sigma_{\tilde{x},1}^-$$

When a series of steps described above are performed, the first estimation of the state of the secondary battery is completed.

When the state estimate of the system is completed, at S130, the control unit 130 counts time and determines whether or not the pre-determined time $\Delta t$ has elapsed.

When determining that the pre-determined time has elapsed, at S140, the control unit 130 monitors through the sensor unit 120 the direction and magnitude of the current flowing through the secondary battery and determines whether charging or discharging of the secondary battery continues or not.

When determining that the secondary battery charging or discharging continues, the control unit 130 moves the process to S60, and accordingly, increases the time index k by 1 and resumes iterating the Extended Kalman Filter algorithm.

The recursive algorithm described above repeats whenever a predetermined time $\Delta t$ elapses while the secondary battery is being charged or discharged. Further, the estimated state of the system by the Extended Kalman Filter approximately follows the actual state of the secondary battery as the recursive algorithm repeats.

Meanwhile, when determining that charging or discharging is finished, at S140, the control unit 130 finishes the secondary battery state estimation with the Extended Kalman Filter.

The control unit 130 may store the results determined at each step of the Extended Kalman Filter algorithm into the storage unit 160, transmit to another external control unit, or display as a graphic interface through the display unit 150. The 'graphic interface' as used herein encompasses text, picture, graph or a combination thereof.

Further, the control unit 130 may use the voltage of the secondary battery as estimated at the third step of the Extended Kalman Filter algorithm in order to control charging or discharging of the secondary battery. Further, the control unit 130 may refer to the estimated voltage when determining the state of charge or capacity degradation of the secondary battery. In this case, the control unit 130 may be included as a part of a battery management system which controls overall operation of the secondary battery.

Alternatively, the control unit 130 may transmit the voltage of the secondary battery as estimated at the third step of the Extended Kalman Filter algorithm to a control unit in charge of controlling charging or discharging of the secondary battery. For example, for a secondary battery mounted on an electric vehicle or a hybrid vehicle, the control unit 130 may transmit the estimated voltage of the secondary battery to the central control unit of the vehicle.

Further, the control unit 130 may estimate the state of charge $z_{cell}[k]$ ($k=1, 2, 3, \ldots$) of the secondary battery with any one of the equations provided below, whenever the state of the system is estimated by using the Extended Kalman Filter.

$$\hat{z}_{cell}[k] = \hat{z}_a^+[k]$$

$$\hat{z}_{cell}[k] = \alpha \hat{z}_{c1}^+[k] + \beta \hat{z}_{c2}^+[k]$$

Referring to the equations provided above, $\alpha$ and $\beta$ denote ratios of the capacities of the first positive electrode material and the second positive electrode material with respect to the total capacity of the secondary battery. For example, when the capacities of the first positive electrode material and the second positive electrode material are 20% and 80% of the total capacity, $\alpha$ and $\beta$ are 0.2 and 0.8, respectively.

Further, the control unit 130 may store the state of charge $\hat{z}_{cell}[k]$ to the storage unit 160, output as a graphic interface through the display unit 150, or transmit to an external control unit through a communication interface or a data transmission interface.

The control unit 130 may optionally include a known processor for implementing a variety of control logics including those described above, application-specific integrated circuit (ASIC), other chipsets, logic circuit, register, communication modem, data processor, and so on. Further, when the control logic is implemented as software, the control unit 130 may be implemented as a set of program modules. In this case, the program modules may be stored at a memory and executed by the processor. The memory may be internal or external to the processor and may be connected with the processor with a variety of known computer components. Further, the memory may be included in the storage unit 160 of the present disclosure. Further, the 'memory' collectively refers to any type of devices where information is stored, and is not intended to refer to any specific memory device.

Further, it is apparent that the control logics of the control unit 130 may construct a process of a method for estimating a state of a secondary battery according to embodiments of the present disclosure.

Further, at least one or more of control logics of the control unit 130 may be combined and written in a computer-readable code system and recorded on a computer-readable recording medium. The recording medium is not limited to any specific type, as long as it is accessible by a processor included in the computer. In one example, the recording medium may include at least one selected from the group consisting of ROM, RAM, register, CD-ROM, magnetic tape, hard disk, floppy disk, and optical data recording device. Further, the code system may be modulated into carrier signals and included in the communication carriers at a specific time point, and distributed over a networked computer and stored and executed therein. Further, programmers in the technical field pertinent to the present disclosure will be easily able to envision functional programs, codes and code segments to implement the combined control logics.

According to the present disclosure, the secondary battery may include a positive electrode including a blended positive electrode material, a negative electrode including a negative electrode material, and a separator.

In one embodiment, the positive electrode may include a thin planar metal current collector consisting of a conductive material, and a positive electrode material coating layer containing the blended positive electrode material and being coated on at least one surface of the metal current collector.

The metal current collector consists of a chemically-stable, and highly-conductive material. For example, the metal current collector may consist of aluminum, stainless steel, nickel, titanium, sintered carbon, and so on. In another example, the metal current collector may consist of aluminum or stainless steel, with carbon, nickel, titanium, silver, and so on coated on a surface thereof.

In addition to the blended positive electrode material, the positive electrode material coating layer may also include an additive such as a conducting agent, a binder, and so on.

The conducting agent is not limited to any specific type of material, as long as it can enhance electrical conductivity of the blended positive electrode material, and may include, without limitation, a variety of conductive carbon materials such as graphite, carbon black, acetylene black, ketjen black, super-P, carbon nanotubes, and so on.

The binder is not limited to any specific type, as long as the material enables close physical bonding between particles of the blended positive electrode material and close interface bonding between the blended positive electrode material and the metal current collector. For non-limiting examples, various types of polymers such as vinylidene fluoride-hexafluoropropylene copolymer (PVDF-co-HFP), polyvinylidenefluoride, polyacrylonitrile, polymethylemethacrylate, and so on may be used as the binder.

In one embodiment, the negative electrode may include a thin planar metal current collector consisting of a conductive material, and a negative electrode material coating layer containing the negative electrode material and being coated on at least one surface of the metal current collector.

The metal current collector consists of a chemically-stable, and highly-conductive material. For example, the metal current collector may consist of copper, aluminum, stainless steel, nickel, titanium, sintered carbon, and so on. In another example, the metal current collector may consist of copper or stainless steel or aluminum-cadmium alloy, with carbon, nickel, titanium, silver, and so on coated on a surface thereof.

The negative electrode material is not limited to any specific type, as long as it has different redox potential from the blended positive electrode material and acts to intercalate the operating ions during charging, while de-intercalating the operating ions during discharging.

The non-limiting example of the negative electrode material may include carbon material, lithium metal, silicon, tin, and so on, or a metal oxide such as $TiO_2$, $SnO_2$ having electrical potential of less than 2 V. Preferably, carbonaceous material may be used, and either the low-crystalline carbon or the high-crystalline carbon may be used as the carbonaceous material. The representative example of the low-crystalline carbon includes soft carbon and hard carbon, and the representative example of the high-crystalline carbon includes high-temperature sintered carbon such as natural graphite, artificial graphite, Kish graphite, pyrolytic carbon, mesophase pitch based carbon fiber, meso-carbon microbeads, mesophase pitches, petroleum-derived cokes, tar pitch-derived cokes, and so on.

In addition to the negative electrode material, the negative electrode material coating layer may also include an additive such as a conducting agent, a binder, and so on. For the conducting agent and the binder, materials that can be used as the conducting agent and the binder included in the positive electrode material coating layer may be used.

The separator is not limited to any specific type, as long as it has a porous structure to electrically separate the positive electrode and the negative electrode and mediate migration of the operating ions.

In one example, for the separator, a porous polymer film fabricated from polyolefin polymer such as ethylene homopolymer, propylene homopolymer, ethylene/butene copolymer, ethylene/hexene copolymer, ethylene/methacrylate copolymer, and so on, may be used either alone or in a stack. In another example, for the separator, a conventional porous non-woven fabric, such as, non-woven fabric consisting of high melting point glass fiber, polyethylene terephthalate fiber, and so on, may be used.

Meanwhile, at least one surface of the separator may include a coating layer of inorganic particles. Further, the separator itself may be formed as a coating layer of inorganic particles. The particles forming the coating layer may have the structure bonded with the binder so that interstitial volume is present between adjacent particles. For such structure, reference is made to PCT Publication WO/2006/025662, the disclosure of which is incorporated herein by reference in its entirety. The inorganic particles may consist of inorganic substance having dielectric constant of 5 or higher. A non-limiting example of the inorganic particle may include at least one material selected from the group consisting of $Pb(Zr,Ti)O_3$ (PZT), $Pb_{1-x}La_xZr_{1-y}Ti_yO_3$ (PLZT), $PB(Mg_{3}Nb_{2/3})O_3$—$PbTiO_3$ (PMN-PT), $BaTiO_3$, hafnia ($HfO_2$), $SrTiO_3$, $TiO_2$, $Al_2O_3$, $ZrO_2$, $SnO_2$, $CeO_2$, MgO, CaO, ZnO and $Y_2O_3$.

The secondary battery may additionally include an electrolyte containing operating ions. The electrolyte is not limited to any specific type, as long as it includes operating ions and can induce electrochemical oxidation or reduction at the positive electrode and the negative electrode by the medium of operating ions.

A non-limiting example of the electrolyte may be salt with a structure such as $A^+B^-$. In the above structure, $A^+$ includes alkali metal cation such as $Li^+$, $Na^+$, $K^+$, or ions consisting of a combination thereof. $B^-$ includes one or more anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$.

The electrolyte dissolved in organic solvent may also be used. For the organic solvent, propylene carbonate (PC), ethylenecarbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone or a mixture of these may be used.

In one embodiment, the secondary battery may additionally include a packing material for sealing the positive electrode, the negative electrode and the separator. With the positive electrode, the negative electrode and the separator sealed by the packing material, the positive electrode and the negative electrode may be coupled with the positive electrode terminal and the negative electrode terminal, respectively, and the positive electrode terminal and the negative electrode terminal may be drawn outside the packing material. Depending on cases, the packing material may function as an electrode terminal, in which case any one of the positive electrode terminal and the negative electrode terminal may be substituted by the packing material. In one example, the negative electrode may be electrically connected with an inner surface of the packing material, in which case an outer surface of the packing material may function as a negative electrode. The packing material is not limited to any specific material, as long as it is chemically safe, and a non-limiting example of this may consist of metal, polymer, soft pouch film, and so on. The soft pouch film may be, as a representative example, an aluminum pouch film having a stack structure of thermal bonding layer, aluminum layer and external protection layer.

An exterior shape of the secondary battery is determined by the structure of the packing material. The generally used packing material structure may be employed, and the exterior shape is not specifically limited to use of the battery. A non-limiting example of the exterior shape of the packing material may include a can structure of cylindrical or rectangular shape, pouch type structure, coin type structure, and so on.

The secondary battery includes an electrode assembly in which a unit cell including at least positive electrode/separator/negative electrode stack structure. The unit cell may have a variety of known structures, such as, for one example, a bi-cell structure having the same polarity at the outermost electrodes, or a full-cell structure having opposite polarities at the outermost electrodes. The bi-cell may have a positive electrode/separator/negative electrode/separator/positive electrode structure, for example. The full-cell may have a positive electrode/separator/negative electrode/separator/positive electrode/separator/negative electrode structure, for example.

The electrode assembly may have a variety of known structures, such as, for one example, a simple stack structure in which the unit cells and the separating films are repeatedly stacked in a bottom-up manner. In another example, the electrode assembly may have a stack folding structure which is formed by disposing the unit cells at predetermined intervals on the separating film, and then folding the separating film as well as the unit cells to a predetermined direction. Further, in yet another example, the electrode assembly may have a jelly roll structure which is formed by laying unit cells, fabricated into sheet shapes extending in one direction, on the separating film, and rolling the separating film as well as the unit cells into a roll shape.

EXPERIMENTAL EXAMPLES

Hereinbelow, performance of the Extended Kalman Filter, designed with the state equation and the output equation according to the present disclosure, will be described by referring to experiments. The Experimental Examples are provided only to help understand the present disclosure, and should not be construed as limiting the scope of the present disclosure.

While there are two state equations described herein, the Experimental Example was conducted using the state Equation (14)' in consideration of ease of experiment.

In the Experimental Example, a pouch type lithium secondary battery was used. The lithium secondary battery includes a positive electrode containing a blended positive electrode material of NMC positive electrode material and LFP positive electrode material blended at 8:2 (weight ratio), and a negative electrode containing carbon material which is generally used.

In order to estimate the state of the secondary battery with the Extended Kalman Filter, charging and discharging tests were conducted according to variation in the state of charge of each of the lithium secondary battery, the NMC positive electrode material half cell, the LFP positive electrode material half cell, and carbon material half cell, and as a result, the open-circuit voltage profile of the lithium secondary battery, and the open-circuit voltage profiles of the NMC positive electrode material, the LFP positive electrode material, and the carbon material were obtained.

Figure 8:
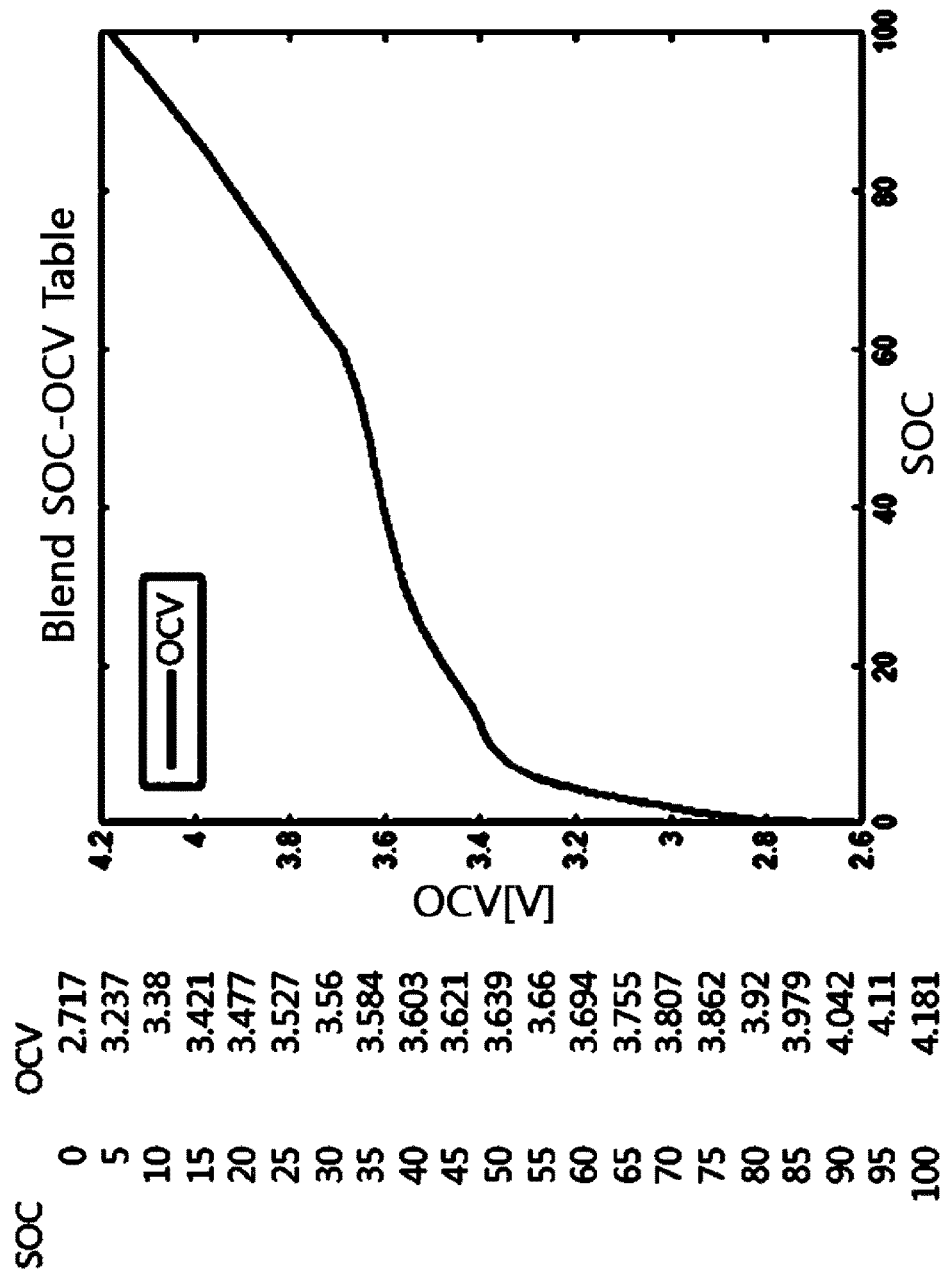
FIG. 8 is a graph of an open-circuit voltage profile of a lithium secondary battery including NMC positive electrode material and LFP positive electrode material, according to changes in the state of charge.
Figure 9:
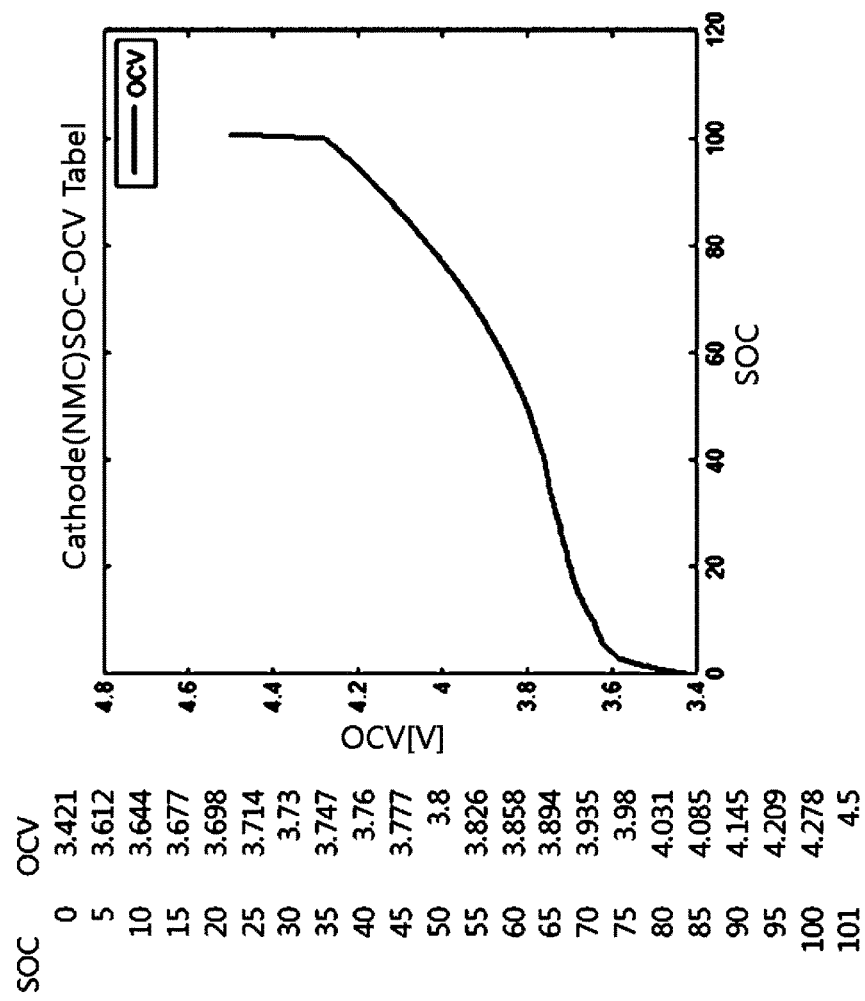
FIG. 9 is a graph of an open-circuit voltage profile of a half cell including NMC positive electrode material, according to variation in the state of charge of the half cell.
Figure 10:
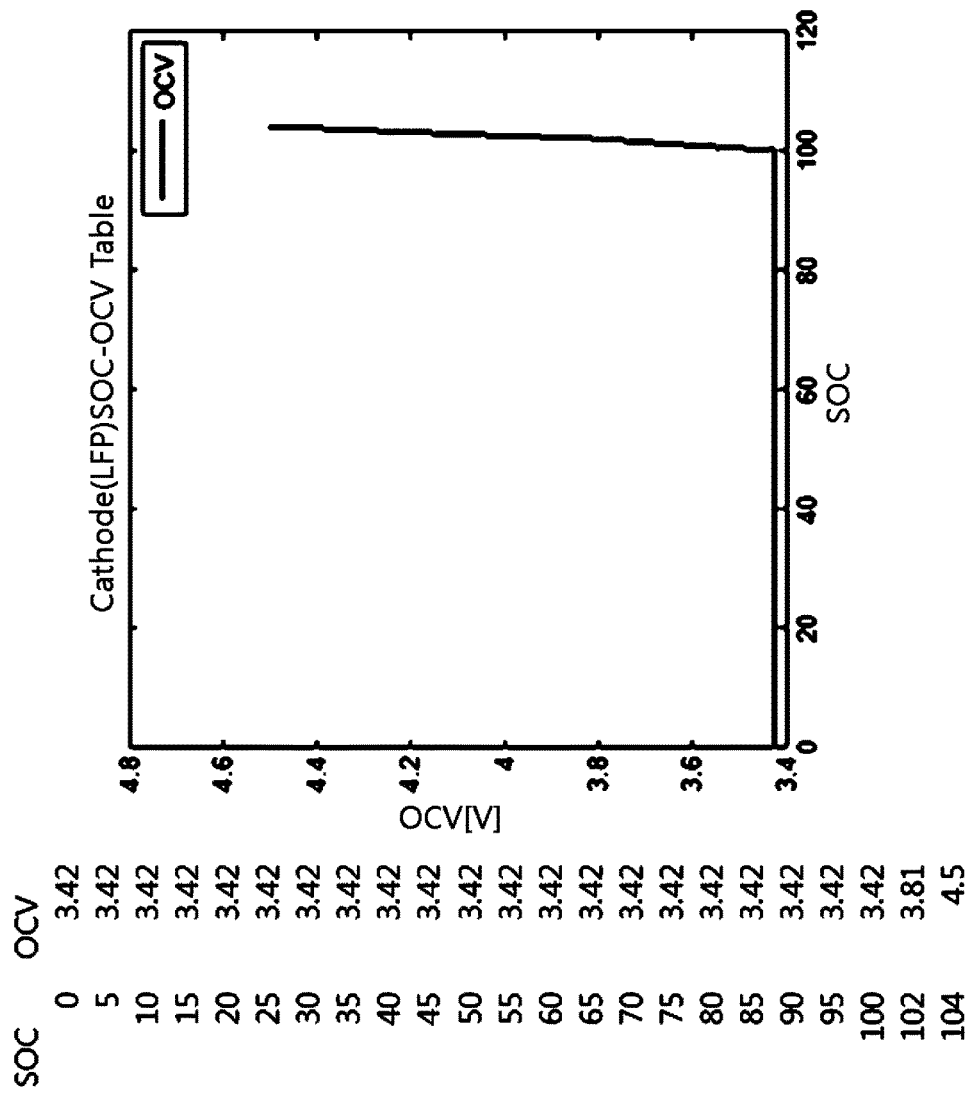
FIG. 10 is a graph of an open-circuit voltage profile of a half cell including LFP positive electrode material, according to variation in the state of charge of the half cell.
Figure 11:
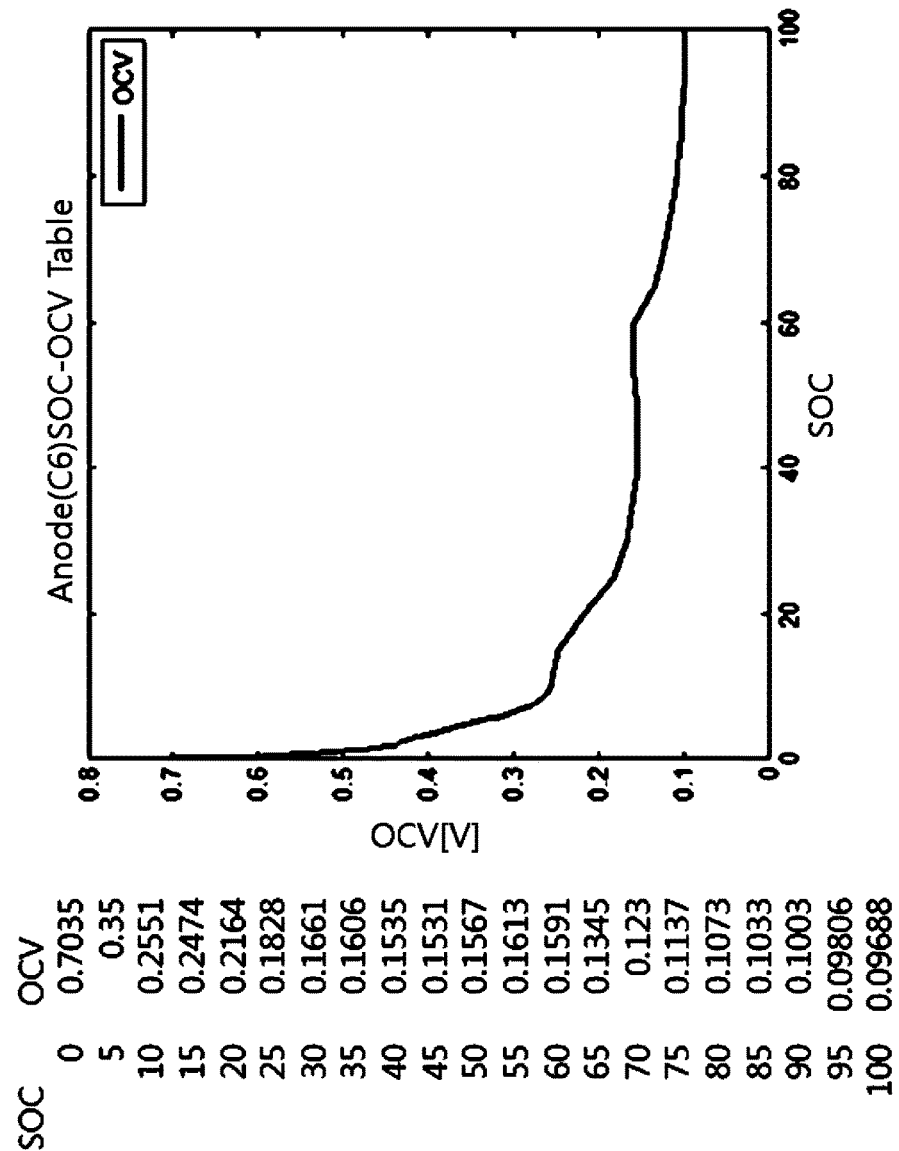
FIG. 11 is a graph of an open-circuit voltage profile of a half cell including carbon material, according to variation in the state of charge of the half cell.

FIG. 8 shows an open-circuit voltage profile according to variation in the state of charge of a lithium secondary battery and a look-up table obtained based on such open-circuit voltage profile, FIG. 9 shows an open-circuit voltage profile according to variation in the state of charge of an NMC positive electrode material half cell and a look-up table obtained based on such open-circuit voltage profile, FIG. 10 shows an open-circuit voltage profile according to variation in the state of charge of a LFP positive electrode material half cell and a look-up table obtained based on such open-circuit voltage profile, and FIG. 11 shows an open-circuit voltage profile according to variation in the state of charge of a negative electrode material half cell and a look-up table obtained based on such open-circuit voltage profile. Lithium electrode was used as the reference electrode for each of the half cells.

The open-circuit voltage profiles and the look-up tables shown in FIGS. 8 to 11 may be referenced when calculating parameters as follows.

$OCV_{c1}(z_{c1}[k])$
$OCV_{c2}(z_{c2}[k])$
$OCV_a(z_a[k])$
$OCV_{cell}^{-1}(V_{cell}[0])$
$OCV_{c1}^{-1}(V_{Cell}[0]+OCV_a(z_a[0]))$
$OCV_{c2}^{-1}(V_{Cell}[0]+OCV_a(z_a[0]))$ In the experiment, the electrical characteristic values of the circuit elements included in the circuit model were tuned under 25° C. condition, as follows.

$R_{c1}$=0.0013786 ohm
$C_{c1}$=14507 farad
$R_{c2}$=0.0046283 ohm
$C_{c2}$=4321 farad
$R_{0,c2}$=0.001768 ohm
$R_a$=0.0001 ohm
$C_a$=10000 farad
$R_{0,a}$=0 ohm
$Q_{c1}$=44650 mAh
$Q_{c2}$=23500 mAh
$Q_a$=47000 mAh
$Q_{cell}$=47000 mAh In order to determine the electrical characteristic values, the half cells and the lithium secondary battery fabricated for the purpose of the experiment were subjected to the AC impedance measurement test and ampere counting test. Next, based on the results obtained from the above tests, an approximate value of each electrical characteristic value was determined, and an optimum tuning value, which can minimize a state estimate error of the Extended Kalman Filter, was determined to be the electrical characteristic value.

Figure 12:
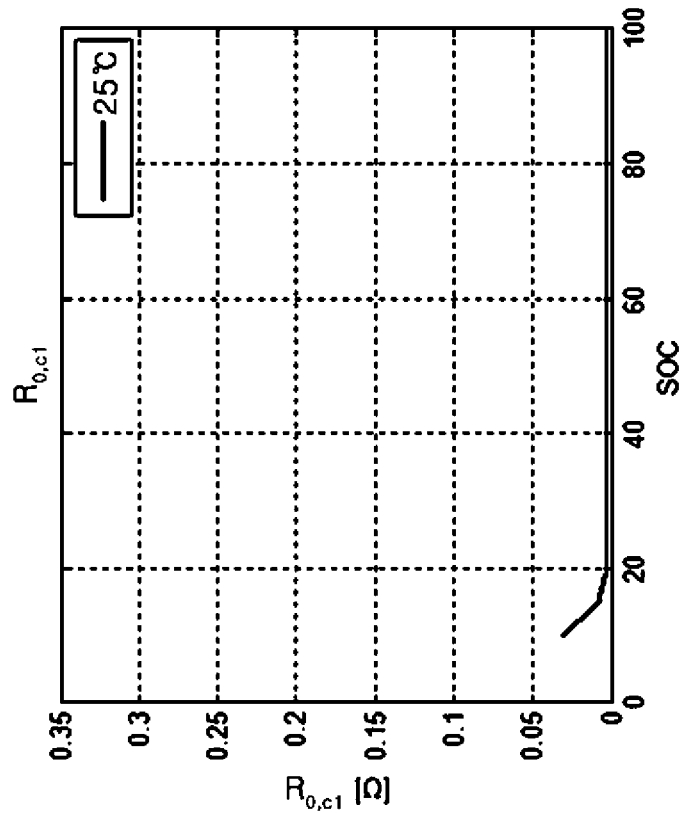
FIG. 12 is a graph of a resistance value variation pattern of $R_{0,c1}$ used in the Examples of the present disclosure, according to variation in the state of charge of the secondary battery.

Meanwhile, under 25° C. condition, $R_{0,c1}$ was varied according to the resistance profile illustrated in FIG. 12 according to the state of charge of the lithium secondary battery. The resistance of the lithium secondary battery including NMC positive electrode material and LFP positive electrode material tends to increase when state of charge is from 20% to 40% (see FIG. 2), and this has to be taken into account as the experiment condition.

For reference, the state-of-charge of 20% to 40% corresponds to the state-of-charge range between which the type of the positive electrode material reacting with lithium ion changes from the NMC positive electrode material to the LFP positive electrode material. Such change of the positive electrode material reacting with the lithium ion is attributable to exhaustion of NMC positive electrode material capacity, which induces increasing of the NMC positive electrode material resistance, and thus $R_{0,c1}$ value is varied to take such phenomenon into consideration.

Referring to FIG. 12 showing the resistance profile and the look-up table (left) obtained based on such open-circuit voltage profile, it is apparent that $R_{0,c1}$ increases when the state of charge of the lithium secondary battery becomes lower than 25%.

The state of charge that starts increasing the magnitude of the resistance component $R_{0,c1}$ may be properly selected using the rule of trial and error, according to the type of the blended positive electrode material. In one example, discharge voltage profile of the lithium secondary battery including the blended positive electrode material may be obtained by experiment, and the state of charge corresponding to voltage at which the curvature of the profile starts to change with reference to the point of inflection appearing on the discharge voltage profile or approximate value thereof may be selected.

Urban Driving Condition Test

For the first test, a fully charged lithium secondary battery was loaded on a constant temperature chamber of a charging and discharging tester, and subjected to charging and discharging test in a simulated situation in which the lithium secondary battery is used as an energy source for a hybrid vehicle in urban driving.

During the charging and discharging test, the constant temperature chamber was controlled to maintain temperature at 25° C., and the state of charge of the lithium secondary battery was gradually decreased from 100% to 0% by repeating pulse discharge which can simulate the urban driving. Meanwhile, the hybrid vehicle has a regeneration charging function during braking or decelerating. In order to simulate such regeneration charging, weak pulse charging was performed during rest time when pulse discharge is suspended.

During the charging and discharging test, voltage and current of the secondary battery was periodically measured at 1 sec intervals, and at equal time interval, the voltage and the state of the secondary battery was estimated by using Equations (14)' and (15)' as the state equation and the output equation of the Extended Kalman Filter.

When implementing the recursive algorithm of the Extended Kalman Filter, the initial conditions for the process noise, the sensor noise and the state estimate error covariance were so tuned that the state estimate error by the Extended Kalman Filter was kept minimum.

Figure 13:
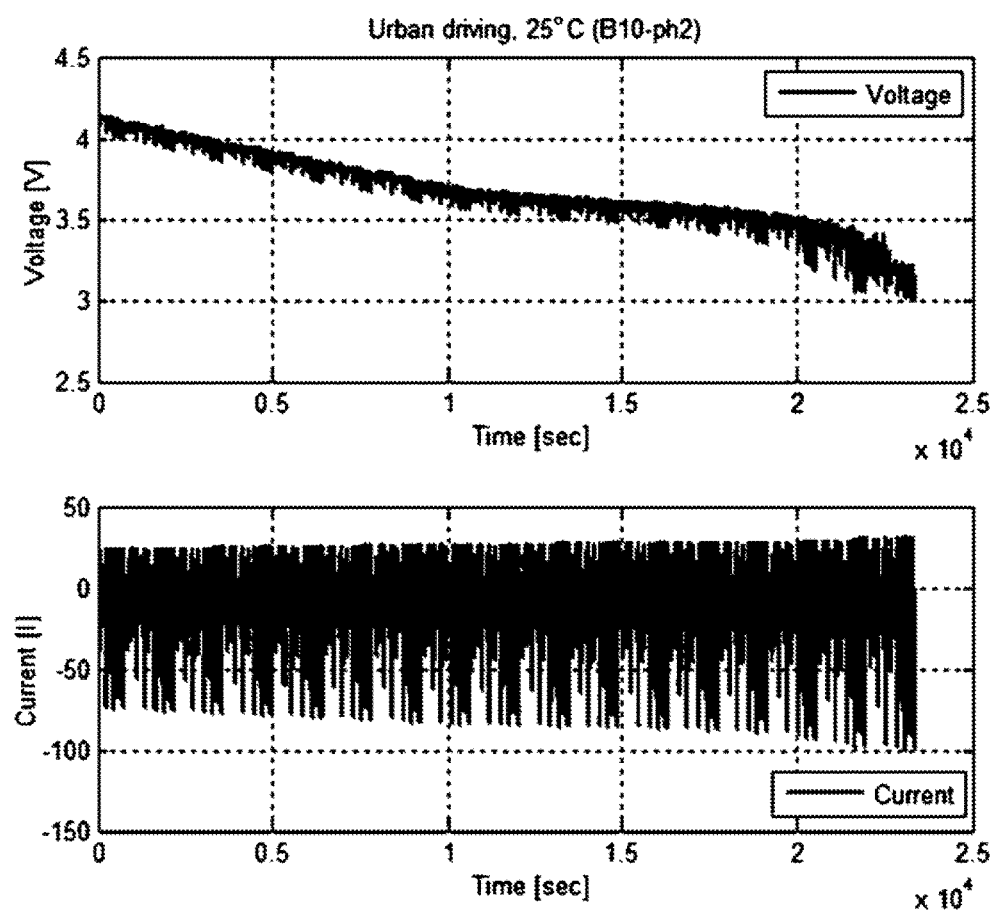
FIG. 13 shows graphs of results of measuring voltages and currents during pulse discharge of a lithium secondary battery in urban driving condition of Example 1 of the present disclosure.
Figure 14:
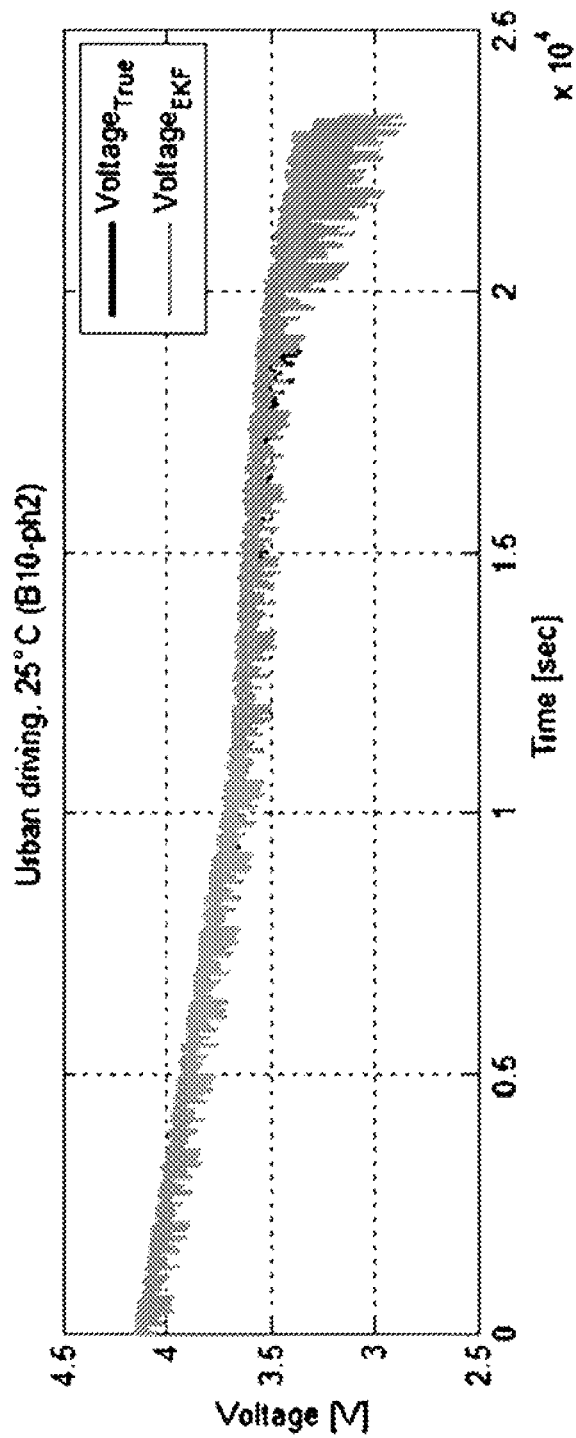
FIG. 14 is a graph of superposition of voltage measured in Example 1 and voltage estimated with the Extended Kalman Filter.
Figure 15:
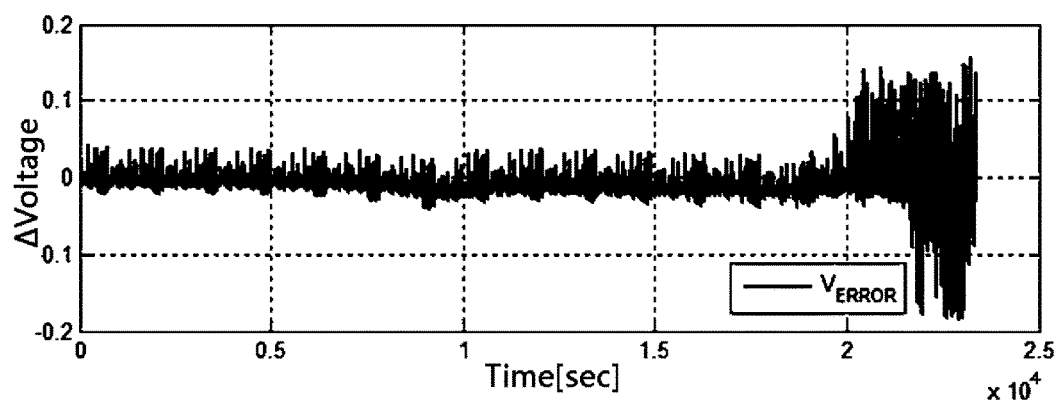
FIG. 15 is a graph of a time-based error between voltage measured in Example 1 and voltage estimated with the Extended Kalman Filter.
Figure 16:
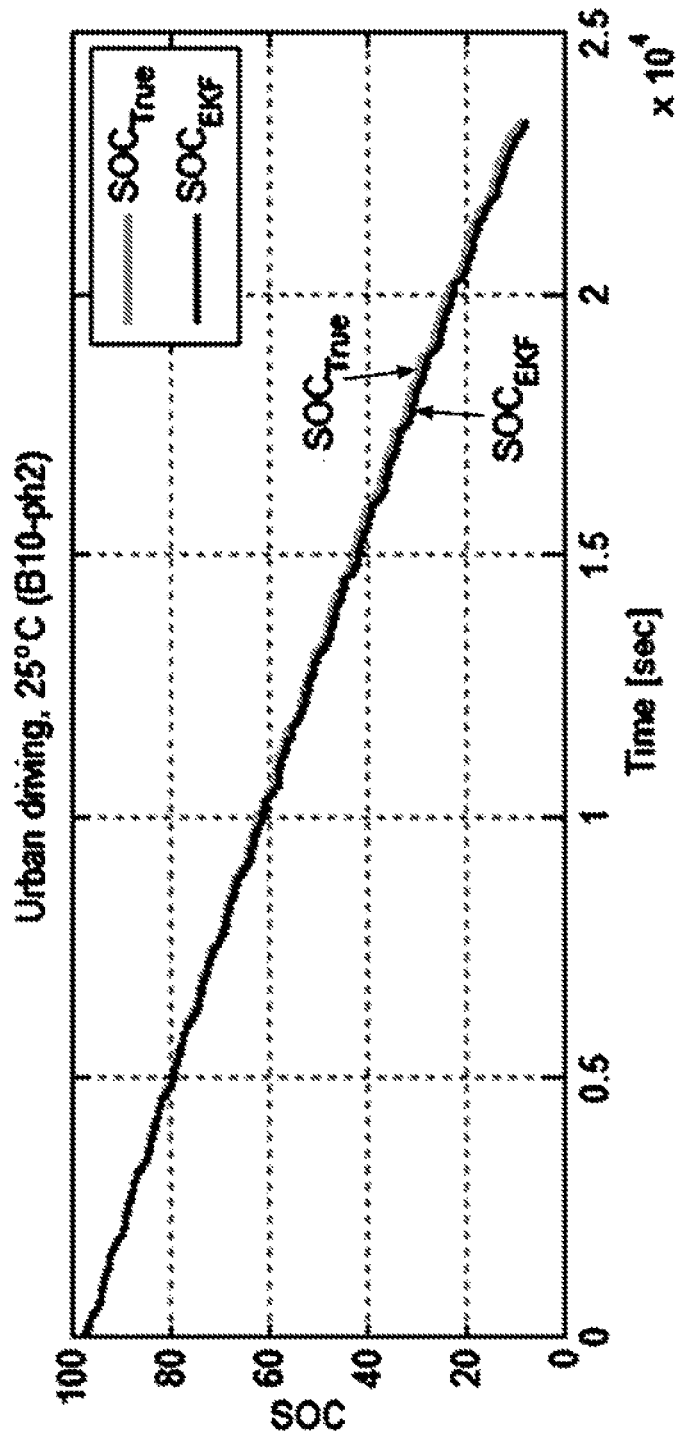
FIG. 16 is a graph of superposition of a state of charge of the secondary battery estimated with the Extended Kalman Filter in Example 1, and actual state of charge.
Figure 17:
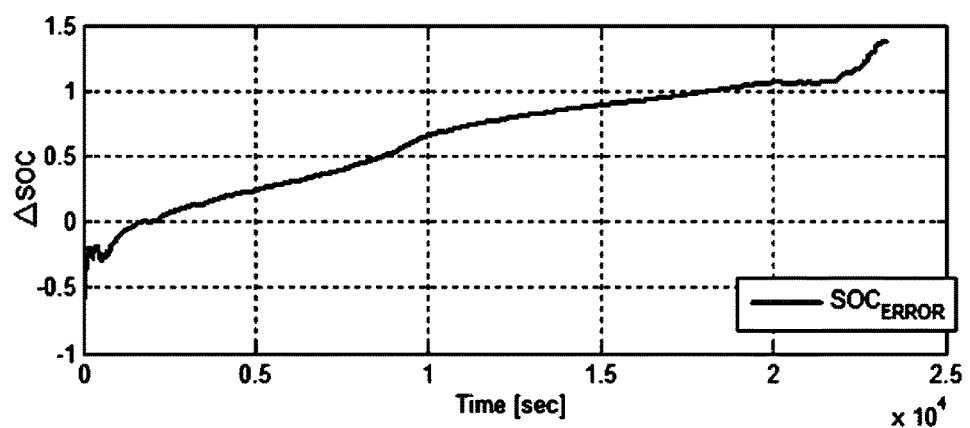
FIG. 17 is a graph of a time-based error between the state of charge estimated in Example 1 and actual state of charge.

FIG. 13 shows graphs representing variation patterns of the voltage and the current measured through a sensor when the lithium secondary battery is pulse-discharged in the test conditions described above, FIG. 14 shows a graph representing both the voltage (black graph) measured through a sensor, and the voltage (gray graph) estimated using the Extended Kalman Filter, FIG. 15 shows a graph representing an error between the measured voltage and the estimated voltage, FIG. 16 shows a graph representing both the actual state of charge (gray graph) of the lithium secondary battery and the estimated state of charge (black graph) by the Extended Kalman Filter, and FIG. 17 shows a graph representing an error between the actual state of charge and estimated state of charge. Among the state parameters estimated by the Extended Kalman Filter, the state of charge of the secondary battery were determined by using $\hat{z}_{c1}^+[k]$ and $\hat{z}_{c2}^+[k]$.

Referring to FIGS. 13 to 17, it is noted that the voltage and the state of charge estimated with the Extended Kalman Filter are changing, while approximately following the measured voltage and the actual state of charge. Further, the error of the estimated voltage was maintained within 0.1 V until the later part of the discharging, and the error of the estimated state of charge was also kept low below 1.5%. Such test result indicates that the circuit model used for deriving the state equation and the output equation of the Extended Kalman Filter can efficiently simulate the electrochemical characteristics of the lithium secondary battery including the blended positive electrode material, and that the Extended Kalman Filter derived from such circuit model exhibits superior performance under charging and discharging conditions as required for urban driving.

Autoroute Driving Condition Test

For the second test, a fully charged lithium secondary battery was subjected to charging and discharging test in a simulated situation in which the lithium secondary battery is used as an energy source for a hybrid vehicle in autoroute driving.

During the test, the temperature of the lithium secondary battery was maintained at 25° C., and the state of charge of the lithium secondary battery was gradually decreased from 100% to 0% while repeating pulse discharge that can simulate the autoroute driving. Further, during rest time when pulse discharging is suspended, weak pulse charging was performed to simulate regeneration charging.

In the second test, the voltage and the current of the secondary battery were measured under the same conditions applied for the first test, and the voltage and the state of charge of the secondary battery were estimated using Equations (14)' and (15)' as the state equation and the output equation of the Extended Kalman Filter.

Further, when implementing the Extended Kalman Filter algorithm, the initial conditions for the process noise, the sensor noise and the state estimate error covariance were so tuned that the state estimate error by the Extended Kalman Filter was kept minimum.

Figure 18:
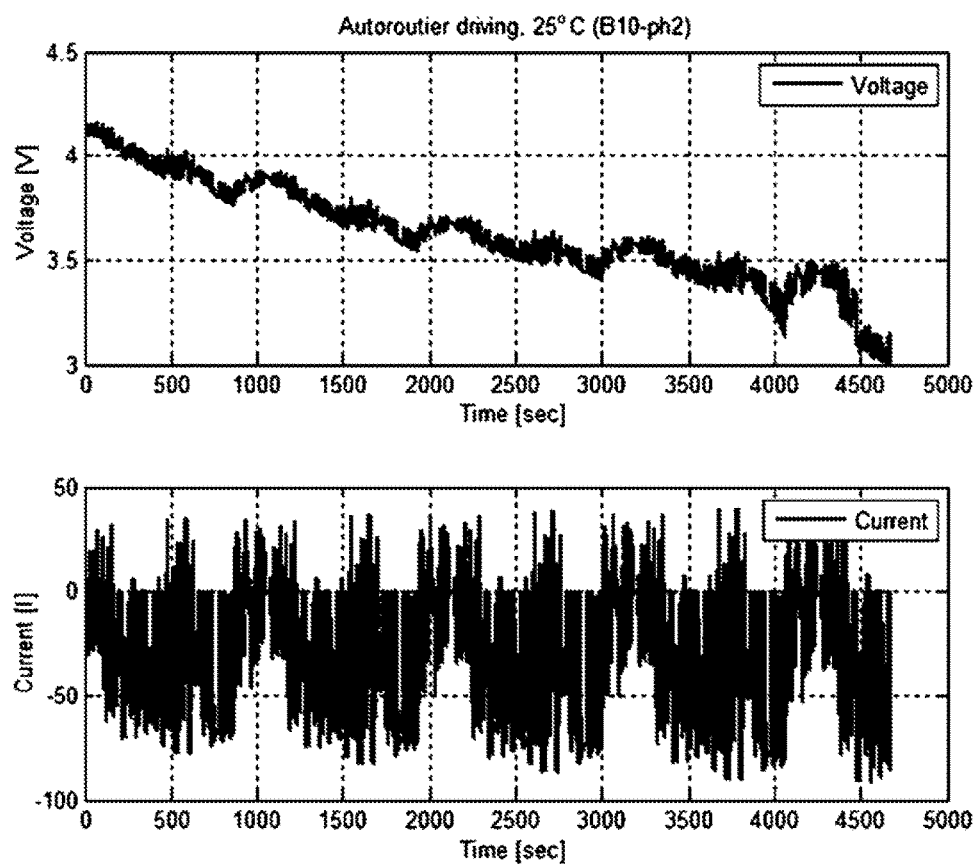
FIG. 18 shows graphs of results of measuring voltages and currents during pulse discharge of a lithium secondary battery in autoroute driving condition of Example 2 of the present disclosure.
Figure 19:
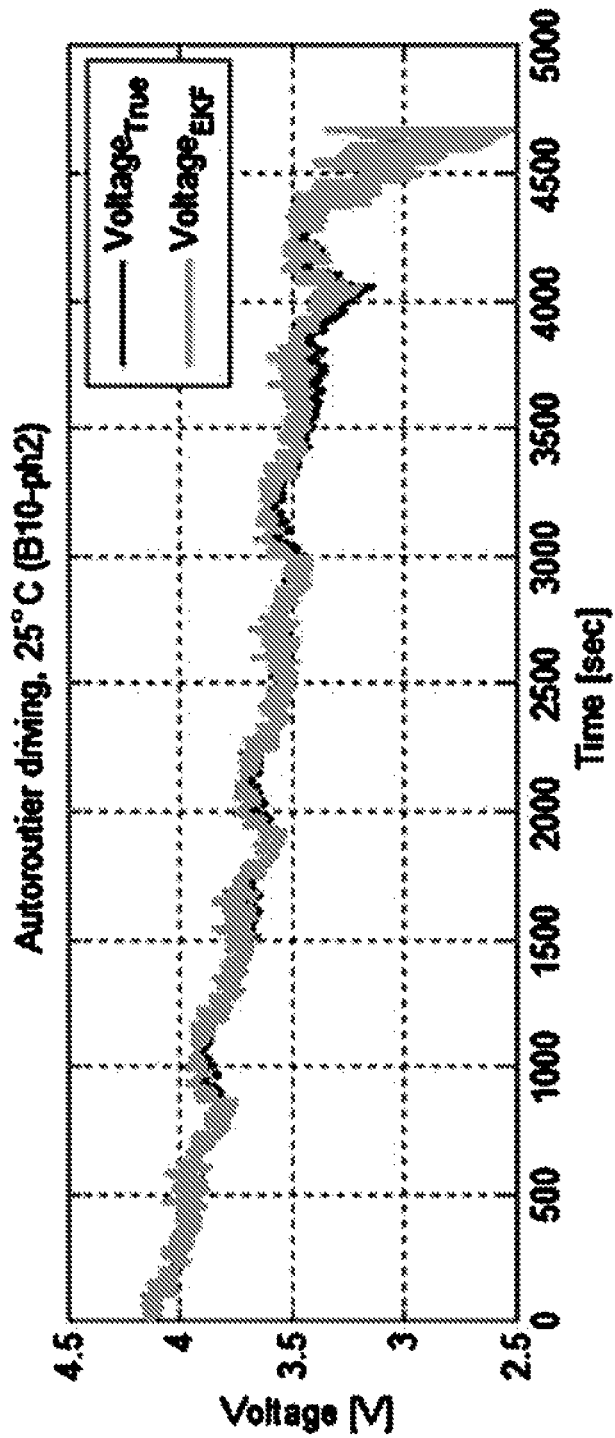
FIG. 19 is a graph of superposition of voltage measured in Example 2 and voltage estimated with the Extended Kalman Filter.
Figure 20:
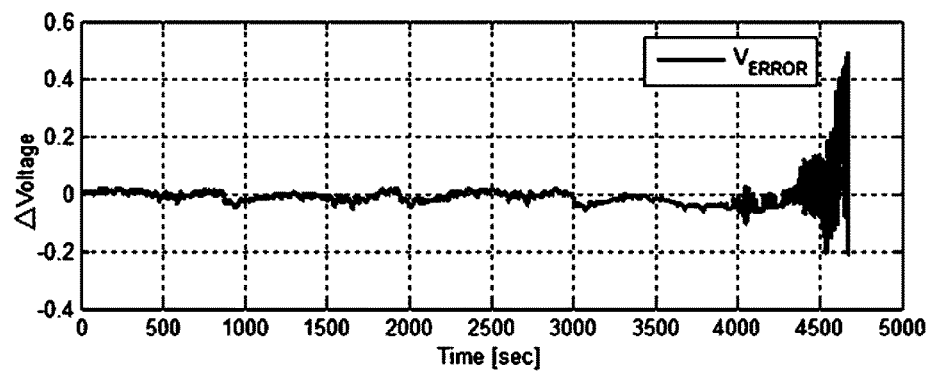
FIG. 20 is a graph of a time-based error between voltage measured in Example 2 and voltage estimated with the Extended Kalman Filter.
Figure 21:
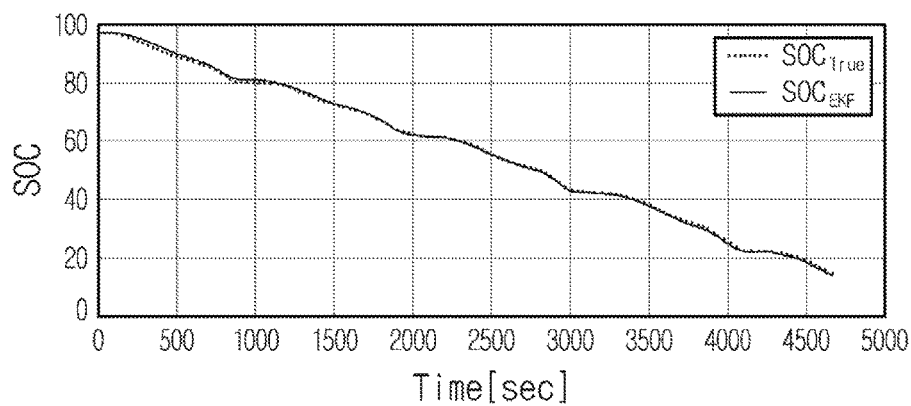
FIG. 21 is a graph of superposition of a state of charge of the secondary battery estimated with the Extended Kalman Filter in Example 2, and actual state of charge.
Figure 22:
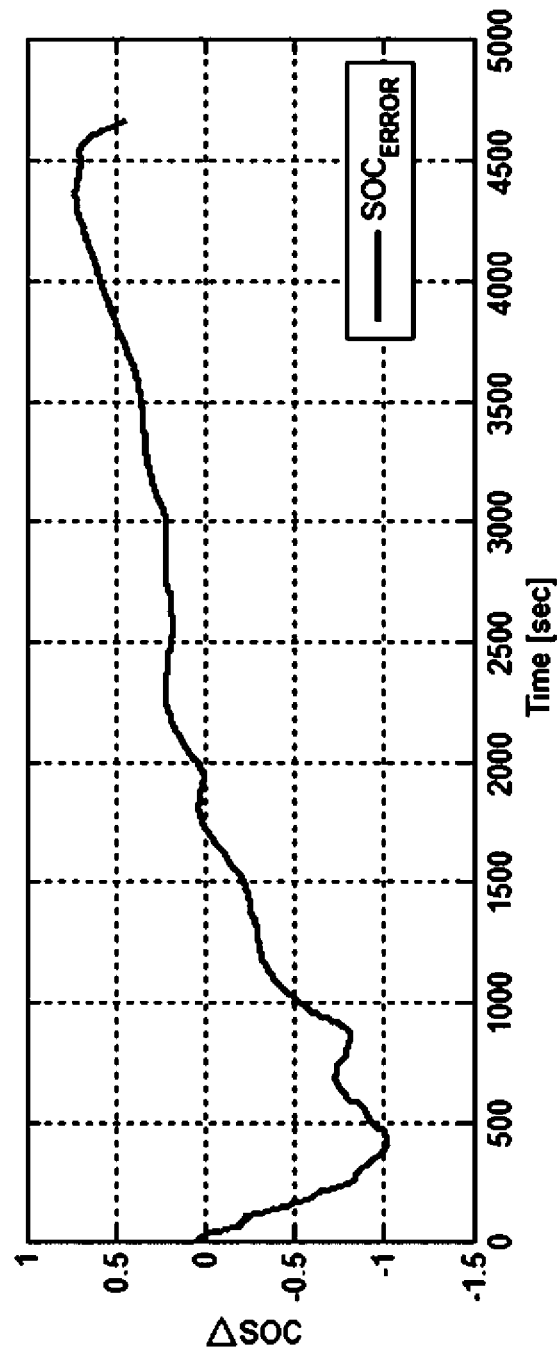
FIG. 22 is a graph of a time-based error between the state of charge estimated in Example 2 and actual state of charge.

FIG. 18 shows graphs representing variation patterns of the voltage and the current measured through a sensor when the lithium secondary battery is pulse-discharged under the autoroute driving condition, FIG. 19 shows a graph representing both the voltage (black graph) measured through a sensor, and the voltage (gray graph) estimated using the Extended Kalman Filter, FIG. 20 shows a graph representing an error between the measured voltage and the estimated voltage, FIG. 21 shows a graph representing both the actual state of charge (in dotted line) of the lithium secondary battery and the estimated state of charge (in solid line) by the Extended Kalman Filter, and FIG. 22 shows a graph representing an error between the actual state of charge and estimated state of charge.

Referring to FIGS. 18 to 22, it is noted that the voltage and the state of charge estimated with the Extended Kalman Filter are changing, while approximately following the measured voltage and the actual state of charge. Further, the error of the estimated voltage was maintained low below 0.1 V until the later part of the discharging, and the error of the estimated state of charge was also low below 0.8%. Such test result indicates that the circuit model used for deriving the state equation and the output equation of the Extended Kalman Filter can efficiently simulate the electrochemical characteristics of the lithium secondary lithium battery including the blended positive electrode material, and that the Extended Kalman Filter derived from such circuit model exhibits superior performance under charging and discharging conditions as required for autoroute driving.

Congestion Driving Condition Test

For the third test, a fully charged lithium secondary battery was subjected to charging and discharging test in a simulated situation in which the lithium secondary battery is used as an energy source for a hybrid vehicle in congestion driving.

During the test, the temperature of the lithium secondary battery was maintained at 25° C., and the state of charge of the lithium secondary battery was gradually decreased from 100% to 0% while repeating pulse discharge that can simulate the congesting driving. Further, during rest time when pulse discharging is suspended, weak pulse charging was performed to simulate regeneration charging.

In the third test, the voltage and the current of the secondary battery were measured under the same conditions applied for the first test, and the voltage and the state of charge of the secondary battery were estimated using Equations (14)' and (15)' as the state equation and the output equation of the Extended Kalman Filter.

Further, when implementing the Extended Kalman Filter algorithm, the initial conditions for the process noise, the sensor noise and the state estimate error covariance were so tuned that the state estimate error by the Extended Kalman Filter was kept minimum.

Figure 23:
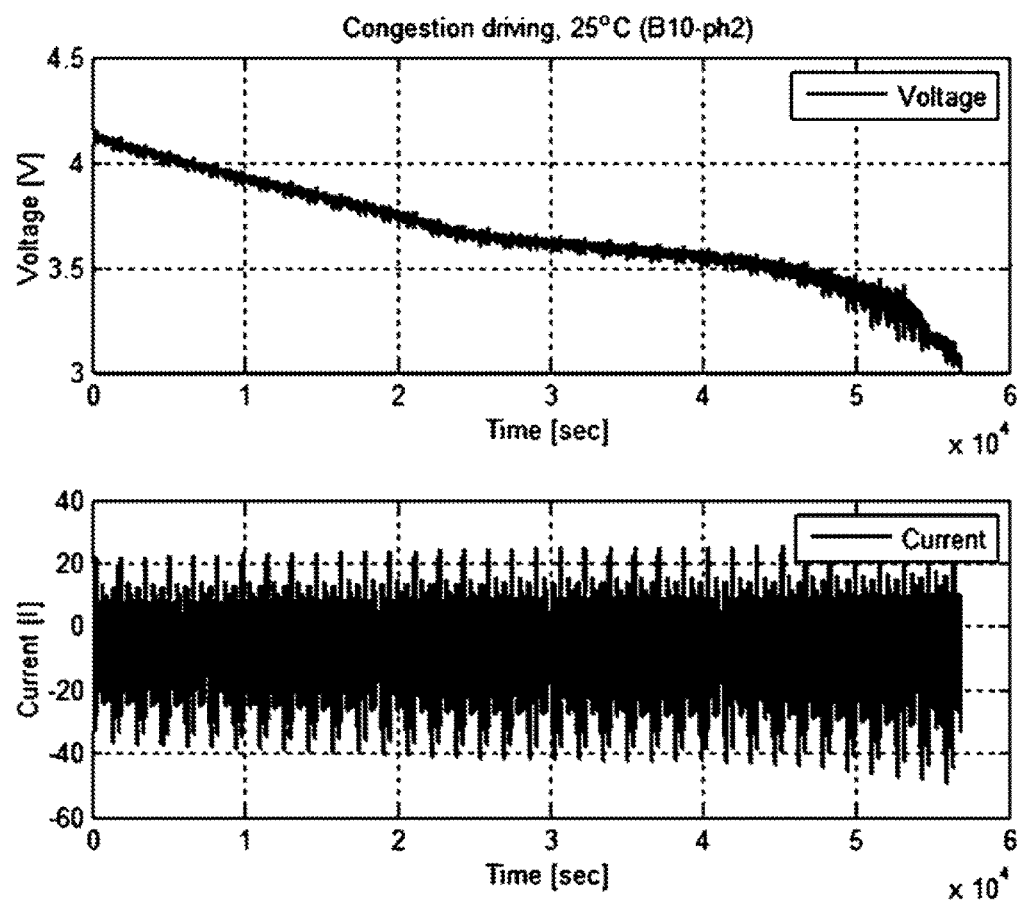
FIG. 23 shows graphs of results of measuring voltages and currents during pulse discharge of a lithium secondary battery in congestion driving condition of Example 3 of the present disclosure.
Figure 24:
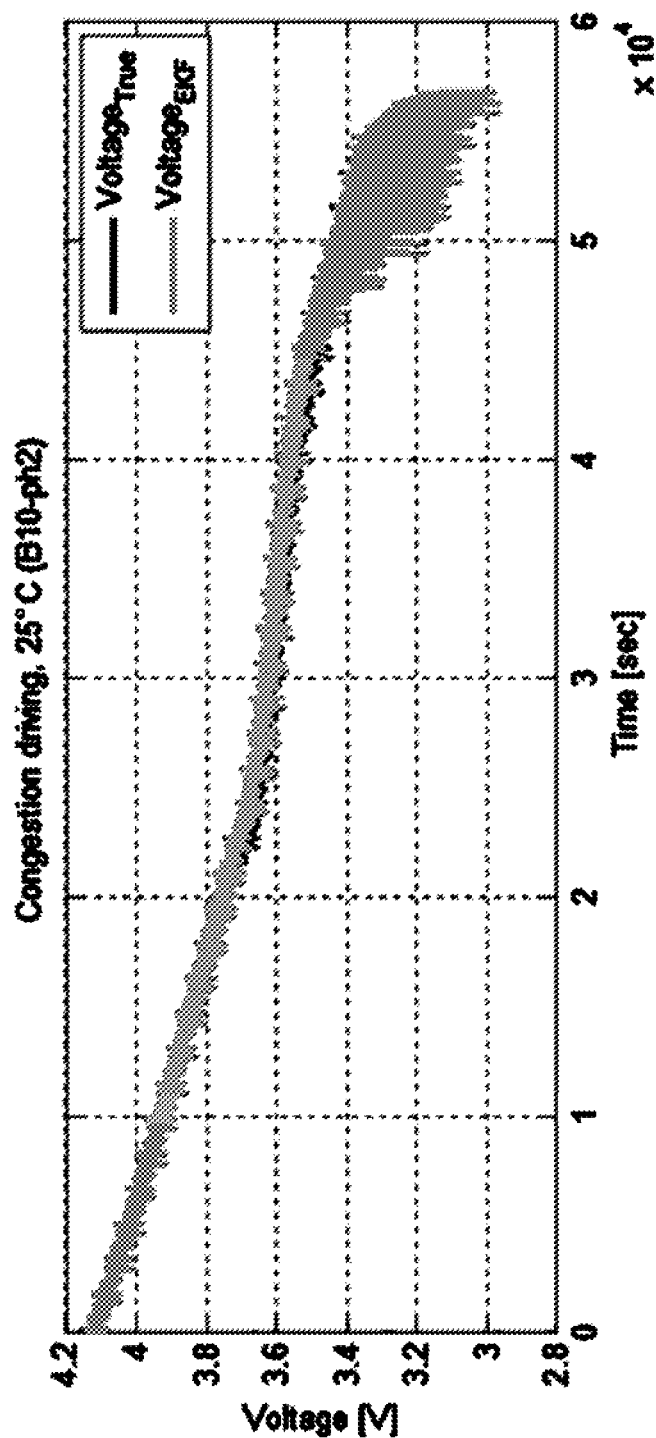
FIG. 24 is a graph of superposition of voltage measured in Example 3 and voltage estimated with the Extended Kalman Filter.
Figure 25:
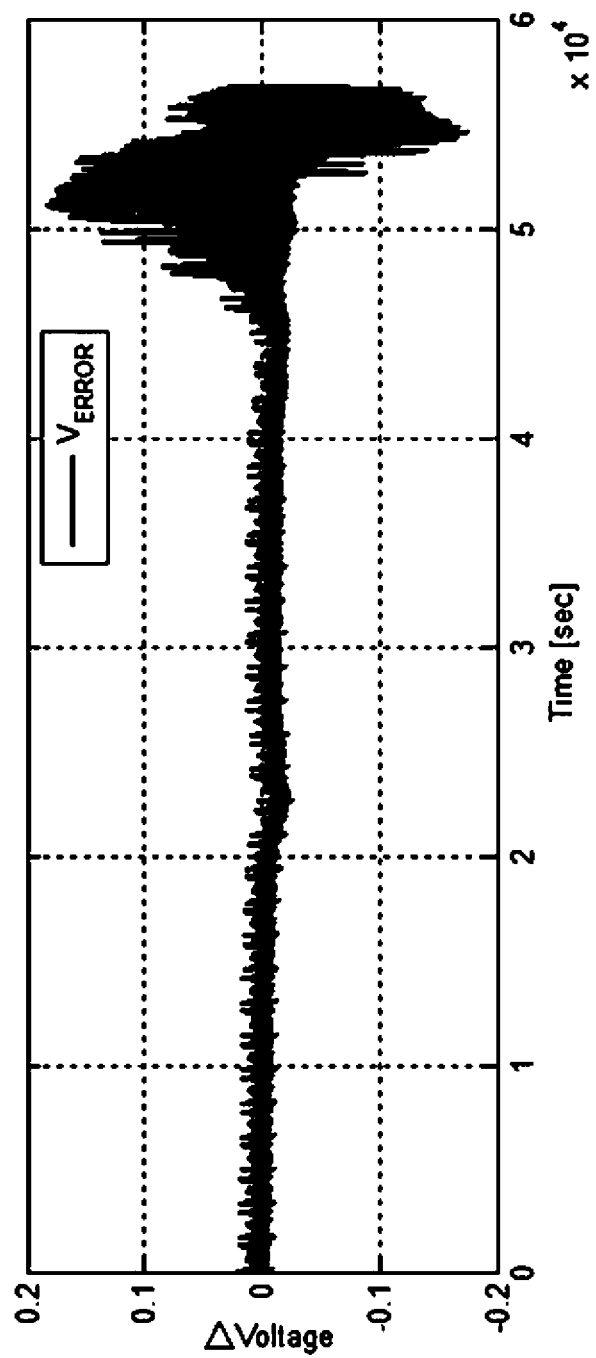
FIG. 25 is a graph of a time-based error between voltage measured in Example 3 and voltage estimated with the Extended Kalman Filter.
Figure 26:
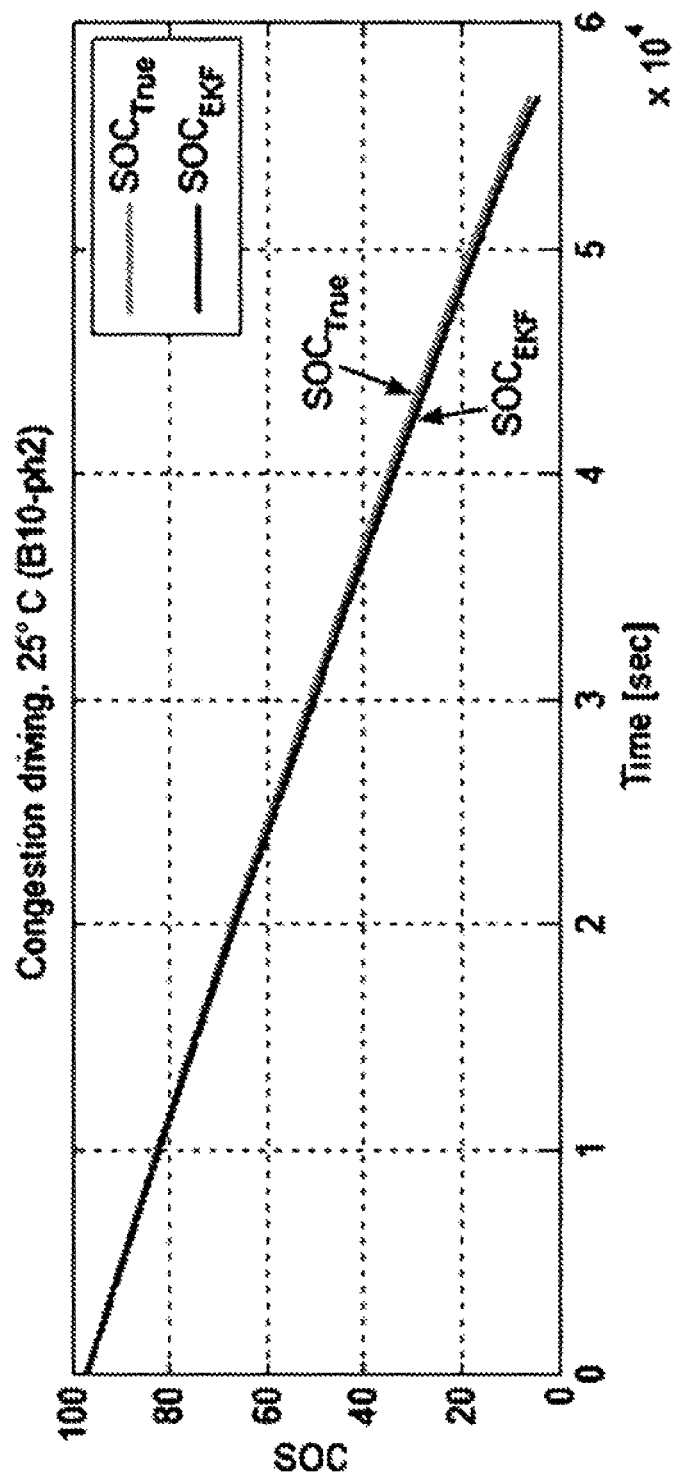
FIG. 26 is a graph of superposition of a state of charge of the secondary battery estimated with the Extended Kalman Filter in Example 3, and actual state of charge.
Figure 27:
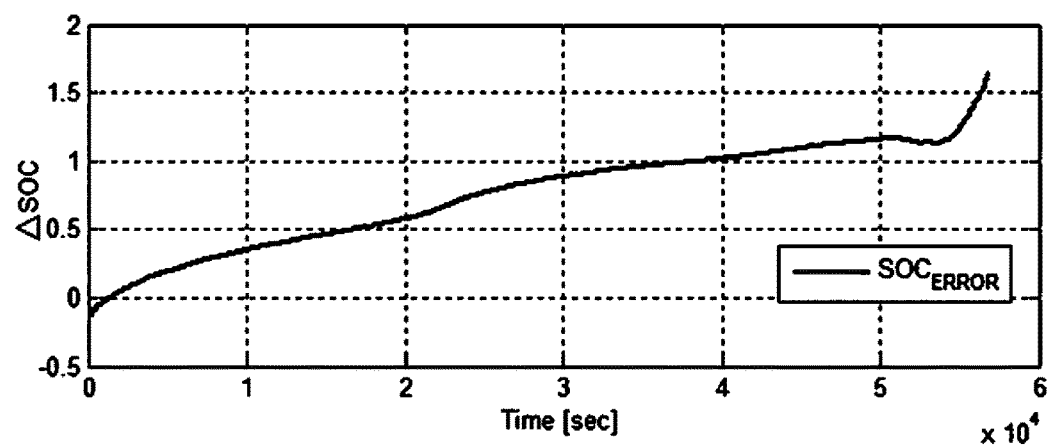
FIG. 27 is a graph of a time-based error between the state of charge estimated in Example 3 and actual state of charge.

FIG. 23 shows graphs representing variation patterns of the voltage and the current measured through a sensor when the lithium secondary battery is pulse-discharged under the congestion driving condition, FIG. 24 shows a graph representing both the voltage (black graph) measured through a sensor, and the voltage (gray graph) estimated using the Extended Kalman Filter, FIG. 25 shows a graph representing an error between the measured voltage and the estimated voltage, FIG. 26 shows a graph representing both the actual state of charge (gray graph) of the lithium secondary battery and the estimated state of charge (black graph) by the Extended Kalman Filter, and FIG. 27 shows a graph representing an error between the actual state of charge and estimated state of charge.

Referring to FIGS. 23 to 27, it is noted that the voltage and the state of charge estimated with the Extended Kalman Filter are changing, while approximately following the measured voltage and the actual state of charge. Further, the error of the estimated voltage was maintained low below 0.05V until the later part of the discharging, and the error of the estimated state of charge was also low below 1.7%. Such test result indicates that the circuit model used for deriving the state equation and the output equation of the Extended Kalman Filter can efficiently simulate the electrochemical characteristics of the lithium secondary lithium battery including the blended positive electrode material, and that the Extended Kalman Filter derived from such circuit model exhibits superior performance under charging and discharging conditions as required for congestion driving.

The technical concepts of the present disclosure described above may be similarly applied to examples in which the positive electrode of the secondary battery includes a single positive electrode material, and the negative electrode includes two or more negative electrode materials.

In one example, the negative electrode of the secondary battery may include a first and a second negative electrode materials with different operating voltage ranges, and the first negative electrode material may be activated at a lower voltage range (or lower state of charge) than the second negative electrode material. That is, the operating ions may be mainly intercalated into the first negative electrode material when the secondary battery has low voltage, while the operating ions may be mainly intercalated into the second negative electrode material when the secondary battery has high voltage. In this case, the operating ions are mainly intercalated into the first negative electrode material as the state of charge of the secondary battery in charge mode begins to increase from 0%. Then when the capacity of the operating ions that can be intercalated into the first negative electrode material is almost exhausted, the operating ions begin to be intercalated into the second negative electrode material.

Those skilled in the art will be easily able to modify the circuit model described above, in consideration of the fact that the negative electrode of the secondary battery includes a blended negative electrode material, and the positive electrode of the secondary battery includes a single positive electrode material. That is, it would be apparent for those skilled in the art that the circuit model used for derivation of the voltage estimation model may be modified into a circuit model that includes a negative electrode material circuit unit including a first negative electrode material circuit unit and a second negative electrode material circuit unit, and a positive electrode material circuit unit, and that the current flowing through the respective circuit units and the voltage formed at the circuit elements included in each of the circuit units may be reinterpreted from the perspective of charging of the secondary battery.

Further, the technical concept of the present disclosure may be similarly applied even to an example in which the positive electrode and the negative electrode of the secondary battery include a blended positive electrode material and a blended negative electrode material, respectively. In this case, it would be apparent for those skilled in the art that the circuit model may be modified into a circuit model including a negative electrode material circuit unit including a first negative electrode material circuit unit and a second negative electrode material circuit unit, and a positive electrode material circuit unit including a first positive electrode material circuit unit and a second positive electrode material circuit unit, and that the current flowing through the respective circuit units and the voltage formed at the circuit elements included in each of the circuit units may be reinterpreted from the perspectives of charging or discharging of the secondary battery.

When the circuit model is modified as described above, it is apparent that the state equation and the output equation of the Extended Kalman Filter derived from such circuit model will also change, and derivation of the state equation and the output equation corresponding to the modified circuit model will be obvious from the technical concept of the present disclosure.

In describing a variety of aspects of the present disclosure, the elements with names ending with 'unit' will have to be understood as the elements that are distinguished functionally, rather than being distinguished physically. Accordingly, the respective elements may be optionally incorporated with another element, or each of the elements may be divided into sub-elements so that the respective elements efficiently implement control logic(s). However, even when the elements are incorporated or divided, it will be obvious to those skilled in the art that the incorporated or divided elements also fall under the scope of the present disclosure, as long as the sameness of functions is acknowledged.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

DESCRIPTION OF REFERENCE NUMERALS

| | |
|---|---|
| 100: secondary battery state estimating apparatus | 110: secondary battery |
| 120: sensor unit | 130: control unit |
| 140: load | 150: display unit |
| 160: storage unit | |

What is claimed is:

1. An apparatus for estimating a state of a secondary battery comprising a blended positive electrode material, wherein the secondary battery comprises a positive electrode including a first positive electrode material and a second positive electrode material having different operating voltage ranges from each other, a negative electrode including a negative electrode material and a separator interposed therebetween, the apparatus comprising:
a sensor unit configured to measure, at time intervals, voltage and current of the secondary battery; and
a battery management system (BMS) electrically coupled to the secondary battery and including a control unit electrically connected with the sensor unit, the control unit being configured to estimate the state of the secondary battery, wherein the state of the secondary battery comprises a state of charge of at least one of the first positive electrode material and the second positive electrode material, by implementing an Extended Kalman Filter algorithm using a state equation and an output equation, wherein the state equation comprises, as a state parameter, the state of charge of at least one of the first positive electrode material and the second positive electrode material, and the output equation comprises, as an output parameter, the voltage of the secondary battery,
wherein the state equation and the output equation are derived from a circuit model comprising a first positive electrode material circuit unit and a second positive electrode material circuit unit respectively corresponding to the first and the second positive electrode materials and being connected in parallel with each other, and a negative electrode material circuit unit corresponding to the negative electrode material and being connected in series with the first and the second positive electrode material circuit units, wherein the BMS includes the circuit model as a software algorithm implemented by a processor of the BMS,
wherein each of the first positive electrode material circuit unit, the second positive electrode material circuit unit, and the negative electrode material circuit unit comprises an open-circuit voltage element varying voltage according to the state of charge of a corresponding electrode material, and an impedance element,
wherein the impedance element includes an RC circuit in which the resistor and the capacitor are connected in parallel, and a resistor connected in series thereto,
wherein the BMS is configured to initiate the charging and discharging of the secondary battery based on the estimated state of the secondary battery, and
wherein the BMS is further configured to increase a time index of said Extended Kalman Filter algorithm in response to a continued charging or discharging of the secondary battery.

2. The apparatus of claim 1, wherein the state parameter further includes a state of charge of the negative electrode material.

3. The apparatus of claim 2, wherein the state equation is defined such that the states of charge of the first positive electrode material, the second positive electrode material, and the negative electrode material are determined by adding up currents flowing through the first positive electrode material circuit unit, the second positive electrode material circuit unit, and the negative electrode material circuit unit according to time, respectively, and
the control unit time-updates the states of charge of the first positive electrode material, the second positive electrode material, and the negative electrode material, by implementing a state estimate time update of the Extended Kalman Filter algorithm, by using the state equation.

4. The apparatus of claim 1, wherein the state parameter includes at least one voltage selected from the group consisting of:
a voltage formed by the impedance element of the first positive electrode material circuit unit;
a voltage formed by the impedance element of the second positive electrode material circuit unit; and
a voltage formed by the impedance element included in the negative electrode material circuit unit.

5. The apparatus of claim 4, wherein the state equation is defined such that voltage formed by the impedance element varies according to time, by an impedance voltage formula derived from circuit analysis of the impedance element included in the first positive electrode material circuit unit, the second positive electrode material circuit unit, and the negative electrode material circuit unit, and
the control unit time-updates the voltage formed by each impedance element, by implementing a state estimate time update of the Extended Kalman Filter algorithm, by using the state equation.

6. The apparatus of claim 1, wherein the state equation includes, as an input parameter, a first current flowing through the first positive electrode material circuit unit, and a second current flowing through the second positive electrode material circuit unit, and
the control unit determines the first current and the second current, by using a current distribution equation derived from the circuit model, and the current measured by the sensor unit.

7. The apparatus of claim 1, wherein the output equation is derived from voltage analysis of the circuit model, and includes a plurality of input parameters, and the plurality of input parameters include:
a current measured by the sensor unit;
an open-circuit voltage component of the first positive electrode material circuit unit;
an open-circuit voltage component of the second positive electrode material circuit unit;

an open-circuit voltage component of the negative electrode material;
an impedance voltage component of the first positive electrode material circuit unit;
an impedance voltage component of the second positive electrode material circuit unit; and
an impedance voltage component of the negative electrode material circuit unit.

8. The apparatus of claim 1, wherein the state equation is defined such that the states of charge of the first positive electrode material and the second positive electrode material are determined by adding up currents flowing through the first positive electrode material circuit unit and the second positive electrode material circuit unit according to time, respectively, and
the control unit time-updates the states of charge of the first positive electrode material and the second positive electrode material by implementing a state estimate time update of the Extended Kalman Filter algorithm, by using the state equation.

9. The apparatus of claim 1, wherein the control unit implements an error covariance time update of the Extended Kalman Filter algorithm, by using Jacobian matrix derived from the state equation.

10. The apparatus of claim 9, wherein the control unit implements a Kalman gain determination of the Extended Kalman Filter algorithm, by using Jacobian matrix derived from the output equation and the time-updated error covariance.

11. The apparatus of claim 10, wherein the control unit implements a state estimate measurement update of the Extended Kalman Filter algorithm, by reflecting the determined Kalman gain to a difference between the measured secondary battery voltage and the estimated secondary battery voltage.

12. The apparatus of claim 10, wherein the control unit implements an error covariance measurement update of the Extended Kalman Filter algorithm, by using the time-updated error covariance and the determined Kalman gain.

13. The apparatus of claim 1, wherein the control unit estimates voltage of the secondary battery, by implementing an output estimate of the Extended Kalman Filter algorithm, by using the output equation.

14. The apparatus of claim 1, wherein the state equation includes a process noise, and the output equation includes a sensor noise.

15. The apparatus of claim 1, wherein the control unit estimates the state of charge of the secondary battery, by using a state of charge of the first positive electrode material and a state of charge of the second positive electrode material, and a capacity of the first positive electrode material and a capacity of the second positive electrode material.

16. The apparatus of claim 1, wherein the open-circuit voltage element and the impedance element are connected in series with each other.

17. An electrically-driven apparatus, comprising the apparatus as defined in claim 1.

18. An apparatus for estimating a state of a secondary battery comprising a blended positive electrode material, wherein the secondary battery comprises a positive electrode including a first positive electrode material and a second positive electrode material having different operating voltage ranges from each other, a negative electrode including a negative electrode material and a separator interposed therebetween, the apparatus comprising:
a sensor unit configured to measure, at time intervals, voltage and current of the secondary battery; and
a battery management system (BMS) electrically coupled to the secondary battery and including a control unit electrically connected with the sensor unit, the control unit being configured to estimate the state of the secondary battery, wherein the state of the secondary battery comprises a state of charge of at least one of the first positive electrode material, the second positive electrode material, and the negative electrode material, by implementing an Extended Kalman Filter algorithm using a state equation and an output equation, wherein the state equation comprises, as a state parameter, the state of charge of at least one of the first positive electrode material, the second positive electrode material, and the negative electrode material, and the output equation comprises, as an output parameter, the voltage of the secondary battery,
wherein the state equation and the output equation are derived from a circuit model comprising a first positive electrode material circuit unit and a second positive electrode material circuit unit respectively corresponding to the first and the second positive electrode materials, and connected in parallel with each other, and a negative electrode material circuit unit corresponding to the negative electrode material and connected in series with the first and the second positive electrode material circuit units, wherein the BMS includes the circuit model as a software algorithm implemented by a processor of the BMS,
wherein each of the first positive electrode material circuit unit, the second positive electrode material circuit unit, and the negative electrode material circuit unit comprises an open-circuit voltage element varying voltage according to the state of charge of a corresponding electrode material, and an impedance element,
wherein the impedance element includes an RC circuit in which the resistor and the capacitor are connected in parallel, and a resistor connected in series thereto,
wherein the BMS is configured to initiate the charging and discharging of the secondary battery based on the estimated state of the secondary battery,
wherein the BMS is further configured to increase a time index of said Extended Kalman Filter algorithm in response to a continued charging or discharging of the secondary battery.

19. An electrically-driven apparatus, comprising the apparatus as defined in claim 18.

20. A method for estimating a state of a secondary battery comprising a blended positive electrode material, wherein the secondary battery comprises a positive electrode including a first positive electrode material and a second positive electrode material having different operating voltage ranges from each other, a negative electrode including a negative electrode material and a separator interposed therebetween, the method comprising:
providing a battery management system (BMS) electrically coupled to the secondary battery;
measuring, at time intervals, voltage and current of the secondary battery; and
estimating the state of the secondary battery via the BMS, wherein the state of the secondary battery comprises a state of charge of at least one of the first positive electrode material and the second positive electrode material, by implementing an Extended Kalman Filter algorithm using a state equation and an output equation, wherein the state equation comprises, as a state parameter, the state of charge of at least one of the first positive electrode material and the second positive electrode material, and the output equation comprises, as an output parameter, the voltage of the secondary battery, and initiating the charging and discharging of the secondary battery via the BMS based on the estimated state of the secondary battery, wherein the state equation and the output equation are derived from a circuit model, wherein the circuit model comprises a first positive electrode material circuit unit comprising an open-circuit voltage element corresponding to the first positive electrode material, and an impedance element, a second positive electrode material circuit unit comprising an open-circuit voltage element corresponding to the second positive electrode material and an impedance element, and being connected in parallel with the first positive electrode material circuit unit, and a negative electrode material circuit unit comprising an open-circuit voltage element corresponding to the negative electrode material and an impedance element, and being connected in series with the first and the second positive electrode material circuit units, wherein the BMS includes the circuit model as a software algorithm implemented by a processor of the BMS, wherein each impedance element includes an RC circuit in which the resistor and the capacitor are connected in parallel, and a resistor connected in series thereto, and wherein the BMS is further configured to increase a time index of said Extended Kalman Filter algorithm in response to a continued charging or discharging of the secondary battery.

21. A computer-readable recording medium recording therein program codes of the method as defined in claim 20.

22. A method for estimating a state of a secondary battery comprising a blended positive electrode material, wherein the secondary battery comprises a positive electrode including a first positive electrode material and a second positive electrode material having different operating voltage ranges from each other, a negative electrode including a negative electrode material and a separator interposed therebetween, the method comprising:

provided a battery management system (BMS) electrically coupled to the secondary battery;

measuring, at time intervals, voltage and current of the secondary battery; and estimating the state of the secondary battery via the BMS, wherein the state of the secondary battery comprises a state of charge of at least one of the first positive electrode material, the second positive electrode material, and the negative electrode material, by implementing an Extended Kalman Filter algorithm using a state equation and an output equation, wherein the state equation comprises, as a state parameter, the state of charge of at least one of the first positive electrode material, the second positive electrode material, and the negative electrode material, and the output equation comprises, as an output parameter, the voltage of the secondary battery, and initiating the charging and discharging of the secondary battery via the BMS based on the estimated state of the secondary battery, wherein the state equation and the output equation are derived from a circuit model, wherein the circuit model comprises a first positive electrode material circuit unit comprising an open-circuit voltage element corresponding to the first positive electrode material, and an impedance element, a second positive electrode material circuit unit comprising an open-circuit voltage element corresponding to the second positive electrode material and an impedance element, and being connected in parallel with the first positive electrode material circuit unit, and a negative electrode material circuit unit comprising an open-circuit voltage element corresponding to the negative electrode material and an impedance element, and being connected in series with the first and the second positive electrode material circuit units, wherein the BMS includes the circuit model as a software algorithm implemented by a processor of the BMS, wherein each impedance element includes an RC circuit in which the resistor and the capacitor are connected in parallel, and a resistor connected in series thereto, and wherein the BMS is further configured to increase a time index of said Extended Kalman Filter algorithm in response to a continued charging or discharging of the secondary battery.

23. A computer-readable recording medium recording therein program codes of the method as defined in claim 22.

* * * * *